United States Patent [19]
Kakuta et al.

[11] Patent Number: 5,463,765
[45] Date of Patent: Oct. 31, 1995

[54] DISK ARRAY SYSTEM, DATA WRITING METHOD THEREOF, AND FAULT RECOVERING METHOD

[75] Inventors: Hitoshi Kakuta, Kokubunji; Yoshihisa Kamo, Musashimurayama; Yoshifumi Takamoto, Hachioji, all of Japan

[73] Assignee: Hitachi, Ltd., Tokyo, Japan

[21] Appl. No.: 34,389

[22] Filed: Mar. 18, 1993

[51] Int. Cl.$^6$ .......................... G11B 20/18; G06F 12/00; G06F 11/10
[52] U.S. Cl. ..................... 395/182.04; 371/40.1; 371/40.2; 371/40.4; 395/441
[58] Field of Search .................... 371/10.1, 40.4, 371/40.1, 40.2; 395/575

[56] References Cited

U.S. PATENT DOCUMENTS

| | | | |
|---|---|---|---|
| 5,088,081 | 2/1992 | Farr et al. | 369/54 |
| 5,124,987 | 6/1992 | Milligan | 371/10.1 |
| 5,278,838 | 6/1994 | Ng et al. | 371/10.1 |
| 5,309,451 | 5/1994 | Noya et al. | 371/40.4 |
| 5,315,602 | 5/1994 | Noya et al. | 371/40.4 |

FOREIGN PATENT DOCUMENTS

| | | | |
|---|---|---|---|
| 9116711 | 10/1991 | European Pat. Off. | G11B 20/18 |
| 9120076 | 12/1991 | European Pat. Off. | G11B 50/12 |
| 3-34161 | 7/1990 | Japan | G11B 20/12 |
| 2-176822 | 2/1992 | Japan | G06F 3/06 |

OTHER PUBLICATIONS

David A. Patterson, et al., A Case for Redundant Arrays of Inexpensive Disks (RAID), Computer Science Division, Univ. of California.

*Primary Examiner*—Robert W. Beausoliel, Jr.
*Assistant Examiner*—Alan M. Fisch
*Attorney, Agent, or Firm*—Antonelli, Terry, Stout & Kraus

[57] ABSTRACT

In a disk array system for RAID (level 5) to improve a process performance by dispersing data, the overhead during data writing operation is reduced. Even when write data are used to rewrite data #1 to data #4, which have already been written at address SADR 2, SADR 2, SADR1 and SADR 3 within drives as data belonging to mutually different parity groups, these data are considered as new write data, and then these new write data are written in parallel into, for instance, an empty region in the drive at the address SADR 4. The updated old data or the updated old parity data are not read out. The invalidation flags for the updated old data are registered into an address conversion table. The subsequent data readout operation is carried out from a newly written region. When all of data within the original parity group are invalidated, the region holding this group is used as an empty region. The valid data within the parity group, which have been partially invalidated, are replaced at a proper timing. In other words, these valid data are acquired to produce a new parity data group which will then be stored into the empty region. In the above operation, it is assumed that a length of data transferred from a host unit is constant, and data belonging to one parity data group has this constant length.

28 Claims, 12 Drawing Sheets

FIG. 3

| CPU DESIGNATION ADDRESS 71 | | 76 | SCSI DRIVE ADDRESS 72 | | PARITY DRIVE ADDRESS 73 | | CACHE ADDRESS 70 | | |
|---|---|---|---|---|---|---|---|---|---|
| DRIVE NUMBER 74 | CCHHR 75 | DM POINTER | SCSI DRIVE No 77 | SCSI ADDR 78 | PARITY DRIVE No 79 | PARITY ADDR 80 | CACHE ADDRESS 81 | CACHE FLAG 82 | ACCESS FLAG 84 |
| DRIVE#1 | ADR 1 | DM a-2 | — | — | — | — | — | — | 1 |
| | ADR 2 | DM c-3 | — | — | — | — | — | — | 0 |
| | ADR 3 | DM d-2 | — | — | — | — | — | — | 1 |
| | ......... | ......... | ......... | ......... | ......... | ......... | ......... | ......... | ......... |
| DRIVE#2 | ADR 1 | — | SD#8 | SADR 1 | SD#12 | SADR 1 | — | 0 | 1 |
| | ADR 2 | — | SD#9 | SADR 1 | SD#12 | SADR 1 | CADR 1,5 | 1 | 0 |
| | ADR 3 | — | SD#10 | SADR 1 | SD#12 | SADR 1 | CADR 1,8 | 1 | 1 |
| | ADR 4 | — | SD#11 | SADR 1 | SD#12 | SADR 1 | CADR 1,6 | 1 | 1 |
| ......... | ......... | ......... | ......... | ......... | ......... | ......... | ......... | ......... | ......... |

FIG.4

| DM POINTER | SCSI DRIVE ADDRESS | | INVALIDA-TION FLAG | PARITY DRIVE ADDRESS | | CACHE ADDRESS | CACHE FLAG | DRIVE FLAG |
|---|---|---|---|---|---|---|---|---|
| | SCSI DRIVE No | SCSI ADDR | | PARITY DRIVE No | PARITY ADDR | | | |
| DM a-1 | SD#1 | SADR 1 | 0 | SD#5 | SADR 1 | CADR 2,5 | 1 | 1 |
| DM a-2 | | SADR 2 | 1 | SD#5 | SADR 2 | CADR 2,8 | 1 | 0 |
| DM a-3 | | SADR 3 | 1 | SD#5 | SADR 3 | ——— | 0 | 0 |
| DM a-4 | | SADR 4 | 1 | SD#5 | SADR 4 | ——— | 0 | 0 |
| ⋮ | | ⋮ | ⋮ | ⋮ | ⋮ | ⋮ | ⋮ | ⋮ |
| DM b-1 | SD#2 | SADR 1 | 0 | SD#5 | SADR 1 | ——— | 0 | 0 |
| DM b-2 | | SADR 2 | 1 | SD#5 | SADR 2 | ——— | 0 | 0 |
| DM b-3 | | SADR 3 | 1 | SD#5 | SADR 3 | CADR 2,3 | 1 | 0 |
| DM b-4 | | SADR 4 | 1 | SD#5 | SADR 4 | ——— | 0 | 0 |
| ⋮ | | ⋮ | ⋮ | ⋮ | ⋮ | ⋮ | ⋮ | ⋮ |
| DM c-1 | SD#3 | SADR 1 | 1 | SD#5 | SADR 1 | CADR 2,9 | 0 | 0 |
| DM c-2 | | SADR 2 | 1 | SD#5 | SADR 2 | ——— | 0 | 0 |
| DM c-3 | | SADR 3 | 0 | SD#5 | SADR 3 | ——— | 0 | 1 |
| DM c-4 | | SADR 4 | 1 | SD#5 | SADR 4 | ——— | 0 | 0 |
| ⋮ | | ⋮ | ⋮ | ⋮ | ⋮ | ⋮ | ⋮ | ⋮ |
| DM d-1 | SD#4 | SADR 1 | 1 | SD#5 | SADR 1 | ——— | 0 | 0 |
| DM d-2 | | SADR 2 | 0 | SD#5 | SADR 2 | CADR 2,2 | 1 | 1 |
| DM d-3 | | SADR 3 | 1 | SD#5 | SADR 3 | CADR 2,7 | 1 | 0 |
| DM d-4 | | SADR 4 | 1 | SD#5 | SADR 4 | ——— | 0 | 1 |
| ⋮ | | ⋮ | ⋮ | ⋮ | ⋮ | ⋮ | ⋮ | ⋮ |
| DM e-1 | SD#5 | SADR 1 | 0 | SD#5 | SADR 1 | ——— | 0 | 0 |
| DM e-2 | | SADR 2 | 0 | SD#5 | SADR 2 | ——— | 0 | 1 |
| DM e-3 | | SADR 3 | 0 | SD#5 | SADR 3 | ——— | 0 | 0 |
| DM e-4 | | SADR 4 | 0 | SD#5 | SADR 4 | ——— | 0 | 0 |
| ⋮ | | ⋮ | ⋮ | ⋮ | ⋮ | ⋮ | ⋮ | ⋮ |

FIG.5

| CPU DESIGNATION ADDRESS 71 | | 75 85 | 81 100 | 82 |
|---|---|---|---|---|
| DRIVE NUMBER 74 | CCHHR | LOGIC GROUP ADDRESS | CACHE FLAG | CACHE FLAG |
| DRIVE#1 | ADR 1 | LADR 1 | — | — |
| | ADR 2 | LADR 3 | — | — |
| | ADR 3 | LADR 8 | — | — |
| | ............ | ............ | ............ | ............ |
| DRIVE#2 | ADR 1 | LADR 2 | — | 0 |
| | ADR 2 | LADR 1 | CADR 1,5 | 1 |
| | ADR 3 | LADR 5 | CADR 1,8 | 1 |
| | ADR 4 | LADR 4 | CADR 1,6 | 1 |
| ............ | ............ | ............ | ............ | ............ |

DISK ARRAY SYSTEM, DATA WRITING METHOD THEREOF, AND FAULT RECOVERING METHOD

BACKGROUND OF THE INVENTION

In the recent computer systems, data required by host units, implying the main computer in a system of computers or terminal connected by communications links, such as a CPU (central processing unit) are stored into a secondary storage device, and data read/write operations are carried out for the secondary storage device upon receipt of a demand issued from the CPU. As this secondary storage device, generally speaking, a nonvolatile storage medium is utilized. Typically, a magnetic disk unit, an optical disk unit and so on are employed as this nonvolatile storage medium. It should be noted that a disk unit will be referred to as a "drive" hereinafter.

In the recent high-technology computer systems, a strong demand has been made to considerably increase the performances of the secondary storage device. As one of the possible solutions for increasing the performances, a disk array arranged by employing a large number of drives each having a relatively small storage capacity may be considered.

In the report "A case for Redundant Arrays of Inexpensive Disks (RAID)" written by D. Patterson, G. Gibson and R. H. Kartz, the performances and reliabilities of the disk arrays (levels 3 and 5) have been described. In the disk array (level 3), data is subdivided and the subdivided data are processed in a parallel mode. In the disk array (level 5), data is distributed and the distributed data are independently handled.

First, a description will be made of the disk array at the level 3, in which the data is subdivided and the subdivided data are processed in the parallel mode. The disk array is arranged by employing a large number of drives each having a relatively small capacity. One piece of write data transferred from the CPU is subdivided into a plurality of subdivided data which will then be used to form parity data. These subdivided data are stored into a plurality of drives in a parallel mode. Conversely, when the data is read out, the subdivided data are read out from the respective drives in a parallel mode, and these subdivided data are combined which will then be transferred to the CPU. It should also be noted that a group of plural data and error correction data will be called a "parity group". In this specification, this terminology will be also employed in such a case that error correction data does not correspond to parity data. This parity data is used to recover data stored in one drive where a fault happens to occur, based upon data and parity data stored in the remaining drives, into which the subdivided data have been stored. In such a disk array arranged by a large number of drives, since the probability of the occurrences of faults is increased due to an increased number of components, such parity data is prepared to improve the reliability of the disk array.

Next, the disk array at the level 5 in which data is distributed and the distributed data are independently handled, will now be explained. In this disk array, a plurality of data is not subdivided but rather is separately handled, parity data is produced from a plurality of data, and then these data are distributively stored into drives each having a relatively small capacity. As previously explained, this parity data is used to recover data stored in a drive where a fault happens to occur during an occurrence of such a fault.

Recently, in the secondary storage device of the large-scale general purpose computer system, since one drive is used in response to other read/write commands, this drive cannot be used and therefore, many waiting conditions happen to occur. In accordance with this disk array, since the data are distributively stored into the plural drives, even when the number of read/write demands is increased, the data are distributively processed in the plural drives, so that such waiting conditions for the read/write demands are suppressed.

In the secondary storage devices of these disk arrays, the storage positions (addresses) for the respective data are fixed to predetermined addresses, and when either data read operation, or data write operation is performed from the CPU, this CPU accesses these fixed addresses.

In the disk array at the level 5, where the data is distributed and the distributed data are independently handled, similar to the large-scale general purpose computer system, a large process overhead is required when the parity data is newly produced during the write operation. This large process overhead will now be explained.

FIG. 11 schematically shows the parity data forming method in the disk array at the level 5 during the data writing operation, in which the data is distributed and the distributed data are independently handled, which has been described in the above-described publication "RAID" proposed by D. Patterson et al. The data present at the respective addresses corresponds to a unit accessed in a single read/write process, and the respective data are independent. Also, in the architecture described in the RAID, the addresses for the data are fixed. As previously explained, in such a disk array system, it is absolutely required to set the parity data in order to improve the reliability of this system. In this disk array system, the parity data is formed by the data at the same address within the respective drives. That is to say, the parity data is produced by the data at the same address (1.1) in the plural drives #1 to #4, and then the resultant parity data is stored into the address (1.1) of the drive used to store the parity data. In this system, the read/write process is performed to access the relevant data in the respective drives, which is similar to the recent large-scale general purpose computer system. In such a disk array, when data is written into, for instance, an address (2.2) of the drive #3, first both of the old data stored at the address (2.2) of the drive #3 and the old parity data stored at the address (2.2) of the drive #5 are read out (step 1), and these read data are exclusive-OR gated with the data to be written to newly produce parity data (step 2).

After the parity data has been formed, the write data is stored into the address (2.2) of the drive #3 and the new parity data is stored into the address (2.2) of the drive #5 (step 3).

As shown in FIG. 12, in the disk array at the level 5, when the old data stored in the data storage drive and the parity data stored in the parity data storage drive are read out, an average waiting time for the disk is required for ½ turn thereof. Thereafter, these data are read to produce new parity data. Then, to store this newly produced parity data and the data, a further waiting time is required for 1 turn of the disk. As a result, the averaged waiting time of 1.5 turns of the disk is required to rewrite the data. In the drive, such a waiting time for 1.5 turns of the disk may cause a great process overhead. To reduce such a process overhead required in the data writing operation, the method for dynamically converting the address of the data write destination has been opened in PCT patent applications WO 91/16711 and WO 91/20076 filed by Storage Technology Cooperation (simply referred to an "STK").

In accordance with this conventional method, when any one of the data designated by the CPU is updated, the overall data belonging to the virtual track containing this data are read into the cache memory, a portion thereof is updated by the update data, and when the updated data belonging to the virtual track is taken out, this data is subdivided in a sector unit of the physical track. A new parity group is produced from the subdivided data, or a combination of the subdivided data and other write data, and then this new parity group is written into the empty region of the drive. In this case, the data belonging to the original virtual track is invalidated. A length of data for constituting a parity group is determined in such a manner that this data owns a capacity of a single physical capacity of a single physical track of a drive. At the proper timing, valid data are acquired from the partially invalidated cylinder containing the invalidated write data, and then are written into other regions, so that this cylinder is made of such a cylinder constituted by only empty regions.

In accordance with this method, since the data constituting the parity data has the length of the physical track, the capacity of the cache memory for holding a plurality of data becomes great until the parity group is formed.

SUMMARY OF THE INVENTION

An object of the present invention is to provide a data writing method and an apparatus for this data writing method, capable of writing update data by way of a dynamic address conversion with employment of a cache memory having a memory capacity smaller than that for holding the update data.

According to one aspect of the present invention, such a disk array system includes includes a plurality of disk drives and a cache memory for temporarily holding a plurality of write data, said plural write data being constructed of either data each having a predetermined data length to be newly written into said plurality of disk drives or data each having said predetermined data length, and for updating data which have been written into said plurality of disk drives which have been transferred from either one or plural host units. The disk array system:

(a) derives from said plural write data held in said cache memory, as data used to constitute an error correcting data group, the write data whose number is equal to a predetermined number and which each has said predetermined data length, and produces error correction data from said derived write data having said predetermined number;

(b) writes in parallel both of the write data having said predetermined number and said error correction data, as a single error correcting data group, into a plurality of empty regions belonging to mutually different drives of said plural drives; and (c) invalidates such a written data that said write data having said predetermined number contain the update data for the data which have been written into said plurality of disk drives.

Thereafter, the valid data contained in the partially invalidated parity group are acquired at a proper timing so as to produce a new parity group. This new parity group is written into the empty region, and all of the valid data contained in the original partially-invalidated parity group are invalidated.

BRIEF DESCRIPTION OF THE DRAWINGS

FIG. 3 is an explanatory diagram of an address table;

FIG. 4 is an explanation diagram of a dynamic address conversion table;

FIG. 5 is an explanation diagram of a group address table (GAT) employed in a third embodiment of the present invention;

DESCRIPTION OF THE PREFERRED EMBODIMENTS (First Embodiment)

(1) Summary

Figure 1:
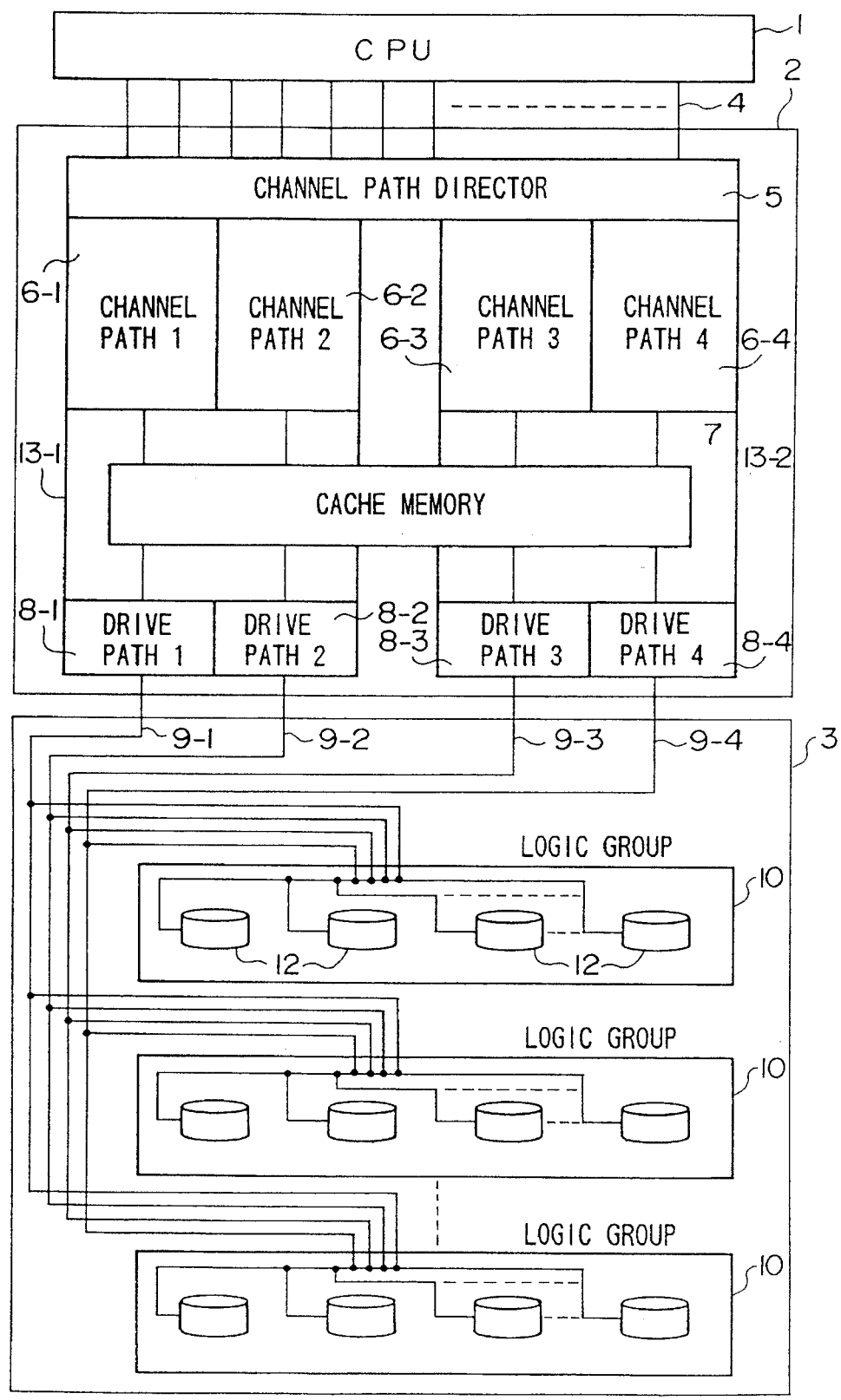
FIG. 1 schematically shows an overall arrangement of a disk array system according to a first embodiment of the present invention.

Referring now to FIG. 1, a disk array system according to an embodiment of the present invention will be described.

The present embodiment is arranged by a CPU 1, an array disk controller (which will be referred to as an "ADC") 2, and an array disk unit (which will be referred to as an "ADU") 3. The ADU 3 is constructed of a plurality of logic groups 10. Each of the logic groups 10 is constituted by "m" pieces of SCSI drives 12, and drive paths 9-1 to 9-4 for connecting the respective SCSI drives 12 with the ADC 2. There is no limitation to the number of the SCSI drives 12 in order to achieve the effects of the present invention. This logic group 10 is a fault recovery unit, and the SCSI drive 12 within this logic group 10 holds an error correction data group constructed of (m−1) pieces of data and parity data generated from (m−1) pieces of data (simply referred to as a "parity group").

Figure 2:
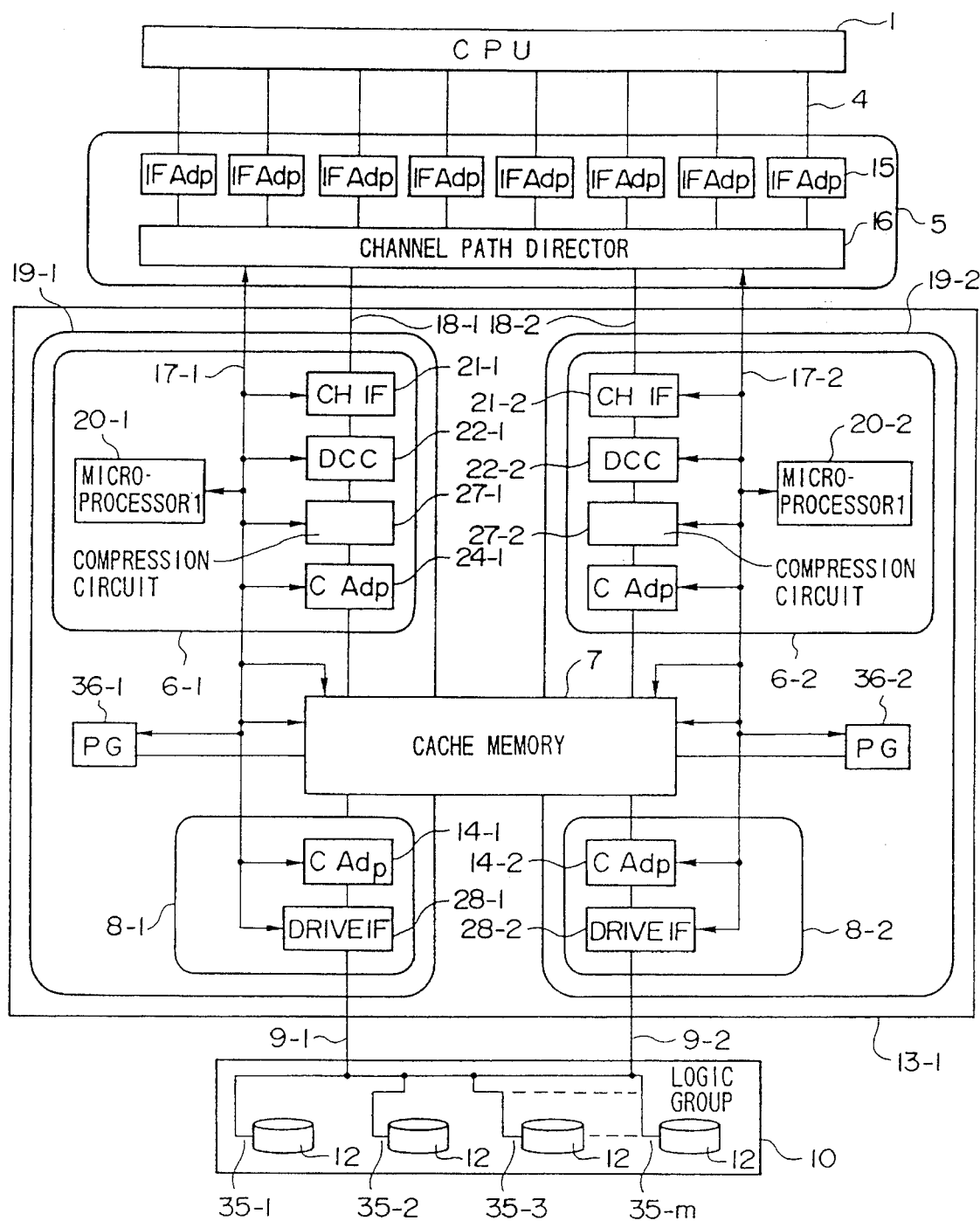
FIG. 2 schematically represents an internal arrangement of a cluster of the first embodiment.

Next, an internal structure of the ADC 2 will now be described with reference to FIG. 1. The ADC 2 is arranged by a channel path director 5, two clusters 13, and a cache 7 such as a nonvolatile semiconductor memory backed-up by a battery. This cache memory 7 stores therein tables for converting data and address. The address conversion table employed in this cache memory 7 is commonly used with respect to all of the clusters in the ADC 2. The cluster 13 corresponds to a set of paths independently operable in the ADC 2. Power supplies and circuits are completely independent among these clusters 13. The cluster 13 is constructed of two sets of channel paths 6 corresponding to the paths between the channel and the cache memory 7, and of the drive paths 6-1 to 6-4 corresponding to the paths between the cache memory 7 and the SCSI drive 12. The respective channel paths 6-1 to 6-4 are connected via the cache memory 7 to the drive path 8. A command issued from the CPU 1 is issued via an external interface path 4 into the channel path director 5 of the ADC 2. The ADC 2 is arranged by two clusters 13. Since each of these clusters is arranged by 2 paths, the ADC 2 is constructed of 4 paths in total. As a result, the ADC 2 can accept 4 commands issued from the CPU 1 at the same time. Thus, when the command is issued from the CPU 1, a judgement is made whether or not this command is acceptable by the channel path director 5 within the ADC 2. FIG. 2 represents an internal arrangement of the channel path director 5 and one cluster 13-1 shown in FIG. 1. As indicated in FIG. 2, the command sent from the CPU 1 to the ADC 2 is fetched by an interface adapter 15. A microprocessor (MP) 20 checks whether or not there is a usable path among the external interface paths 4 in the clusters. If there is a usable external interface path 4, then the MP 20 changes a channel path switch 16 to execute a command accept process, and if such a command is not acceptable, then the MP 20 sends a response "not acceptable" to the CPU 1.

Basically, in the RAID (Redundant Arrays of Inexpensive Disks) at the level 3, error correcting data, e.g., parity data is produced from a plurality of write data, and both of these plural write data and the error correcting data are separated and then stored into a plurality of drives as a single error correcting data group.

As the error correcting data, any data other than the parity data may be used. However, for the sake of simple expression, error correcting data will be simply referred to as "parity data" even when data other than the parity data is utilized, and an error correcting data group will be termed as a "parity group".

An operation of this embodiment will now be summarized.

A method for writing write data transferred from the CPU into the above-explained first region, is followed by the conventional RAID method at the level 5, in principle.

That is, a plurality of write data are held at the cache memory 7, parity data is produced from a predetermined number of write data which are held and have data lengths equal to the record lengths of the physical drives, and these data are distributed and written into first regions provided within plural drives of any one of logic groups 10 as a parity group.

When a demand to read out the written data is made by the CPU, this demanded data is selectively read out therefrom, and then sent via the cache memory 7 to the CPU.

When data to update the written data is transferred from the CPU, both of the written data and the parity data in the parity group to which the written data belongs, are read into the cache memory 7. New parity data is produced from this read data and the updating data, and then both of the last write data and the last parity data are rewritten by this updating data and the new parity data. Consequently, the data within the original parity group is partially updated.

To the contrary, a featured method of this embodiment for writing write data transferred from the CPU into the above-described second region, is performed as follows:

A predetermined number of write data which have been transferred from the CPU and have been stored in the cache memory 7, and are equal to the respective record lengths, are collected to produce parity data, regardless of whether or not these write data correspond to updating data for rewriting data written into any one of the logic groups. The parity data are distributively stored into empty regions of the second regions provided within a plurality of drives of any one of the logic groups 10. As a result, the process overhead occurred when the write data are updated, which has been described in the conventional problems, can be reduced.

If any one of these plural written data corresponds to data for updating the written data, then the written data is invalidated. Consequently, the parity group to which this written data belongs is partially invalidated.

When the above-described write process is carried out for the plural parity groups, the empty regions within the logic group are reduced. Consequently, according to this embodiment, valid data in the parity groups which are partially invalidated are collected to the cache memory 7, from which a new parity group is formed and then stored into the empty region. The partially invalidated parity group from which such a valid data collection has been completed, will be then used as an empty region for writing a new parity group.

As described above, after data having an address designated by the CPU has been written into the second region, when another write data having this address is transferred from the CPU, the latter data is stored in a position within the drive, which is different from the position where the former data has been written. In other words, the address designated by the CPU is dynamically converted into an address within the drive. Consequently, the second region will also be referred to as a "region for dynamically converting an address".

It should be noted in this embodiment that data to be updated is not read out from a drive, but is invalidated. As a result, this dynamic address conversion of the present invention is different from the dynamic address conversion described in the above-described PCT publications, in which highspeed data updating operation can be realized.

(2) Address Conversion Table

In accordance with this embodiment, the SCSI drive 12 for constituting the ADU 3 utilizes a drive of the SCSI interface. Assuming now that as the CPU 1, such a large-scale general purpose computer as the 9000 series of IBM computer system is employed, the command rules for the command system of the channel interface operable by the IBM operating system (OS) are issued from the CPU 1. Then, if the SCSI drive is utilized as the SCSI drive 12, the commands issued from the CPU 1 must be converted into such commands ruled by the command system of the SCSI interface. This conversion is mainly subdivided into a protocol conversion of commands and an address conversion.

A description will now be made of an address converting table.

Figure 13:
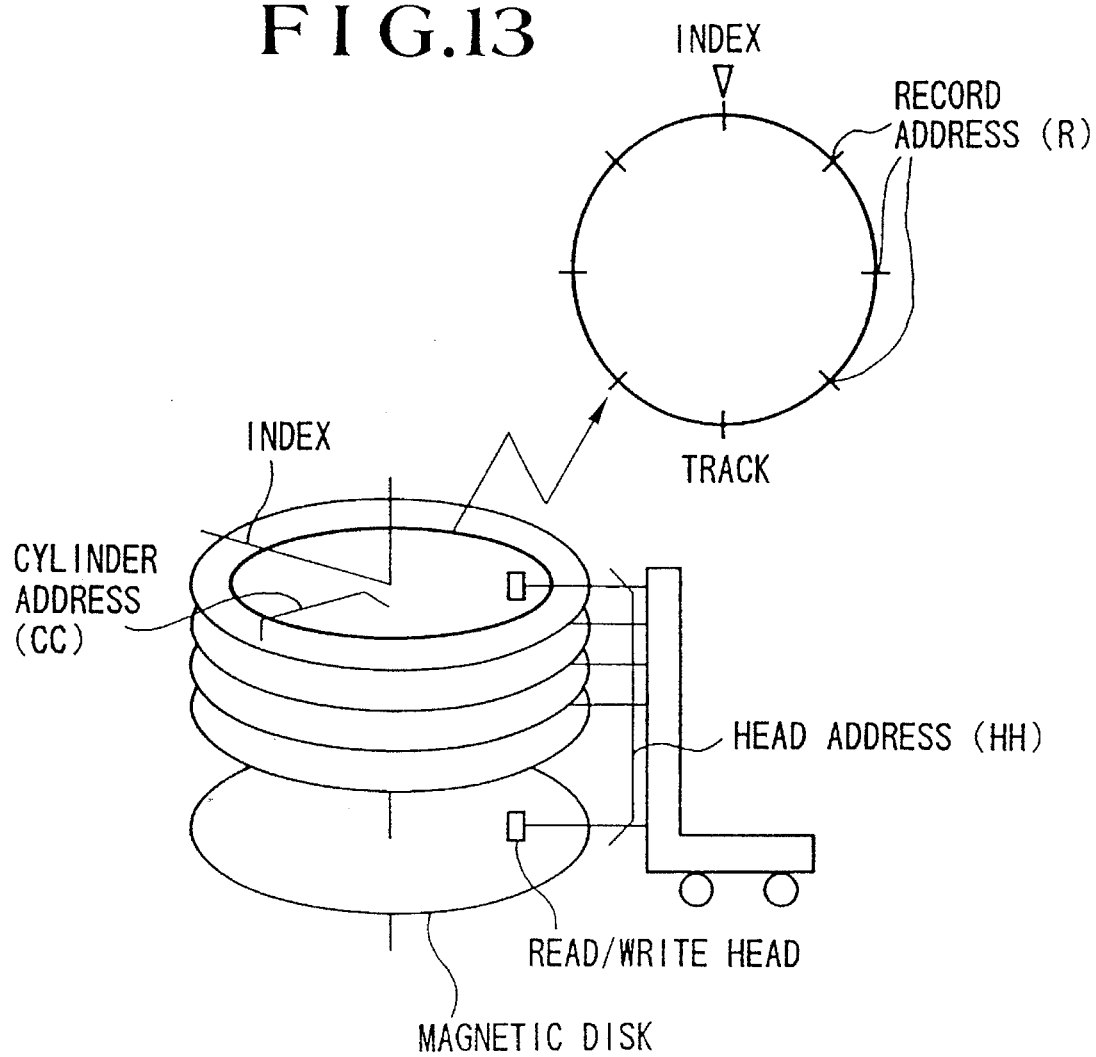
FIG. 13 is an explanatory diagram for an internal address of a drive according to the present invention.

In the following description, it is assumed that a data length transferred from the CPU 1 is equal to either 1 sector length of a drive, or "n" times of 1 sector length ("n" being an integer greater than 1). In this embodiment, write data (record) having "n" times of 1 sector length is subdivided into a plurality of data (blocks) each having a length equal to "m" times of 1 sector length ("m" being an integer smaller than "n"). Then, the subdivided write data are processed. However, for the sake of simplicity, the following description will be made of only such a case that record lengths of data transferred from the CPU 1 are continuously constant. As represented in FIG. 13, the address designated by the CPU 1 specifies a position of a cylinder to which a track belongs where data has been stored, a head address for determining the track on which the data has been stored in this cylinder, and a position of a record within this track. More specifically, this address corresponds to a CCHHR constructed of the number of this relevant drive (drive number) into which demanded data has been stored, a cylinder address (CC) corresponding to the cylinder number within this drive, a head address (HH) corresponding to the head number of head for selecting the track in the cylinder, and a record address (R). In the conventional magnetic disk subsystems (IBM 3990-3390) adaptable to the CKD format, the drives may be accessed in accordance with this address. However, in this embodiment, the conventional magnetic disk subsystem adaptable to the CKD format is logically emulated by a plurality of SCSI drives 12. In other words, the ADC 2 pretends to be the CPU 1 in such a manner that a plurality of SCSI drives 12 correspond to a single drive used in the conventional magnetic disk subsystem adaptable to the CKD format. To this end, the address (CCHHR) designated from the CPU 1 is converted into the address of the SCSI drive by the MP 20. As this address conversion, as represented in FIG. 3, a table 70 for an address conversion (which will be referred to as an "address table") is utilized. This address table 70 has been stored into a proper region within the cache memory 7 in the ADC 2. In this embodiment, the drive designated by the CPU 1 corresponds to a single drive adaptable to the CKD format. However, in accordance with the present invention, since the drive recognized by the CPU 1 as a single drive is practically arranged by a plurality of SCSI drives, this drive is defined as a logic drive. As a result, a CPU-designated address 71 designated by the CPU 1 (this address 71 is arranged by a drive number 74 and the CCHHR 75), is converted into an SCSI drive address 72 corresponding to the SCSI drive 12 (this is arranged by an SCSI drive number 77 and an address 78 within this SCSI drive (which will be referred to as "Addr in SCSI")). In the address table 70, there are stored a CPU designation address 71 designated by the CPU 1; an address 72 within the SCSI drive 12 (SCSI drive address) into which the data corresponding to the SCSI drive address has been actually stored; a parity drive address 73 into which the parity data corresponding to this actually stored data has been stored; an address 81 in the cache memory 7 (cache address); and a cache flag 82 for indicating whether or not this data is present in the cache memory 7. When this cache flag 82 becomes ON (1), it indicates that there is data within the cache memory 7. To the contrary, if this cache flag 82 becomes OFF (0), it denotes that there is no data in the cache memory 7.

Also, a pointer (DM pointer) to a dynamic address conversion table 90 used in performing such a dynamic address conversion, as shown in FIG. 4, has been stored in the address table 70. The SCSI drive address 72 is arranged by the SCSI drive number where the data has been stored (SCSI drive number) 71, and the Addr 78 in SCSI (constructed of the cylinder address, head address, record number, and sector number within the SCSI drive). The number of SCSI drive 79 (parity drive number) to which the parity data corresponding to this data has been stored and an address 80 in the SCSI drive (which will be referred to as an "Addr in parity data") where the parity data has been stored, are stored. It should be noted that an access flag 84 is used in an embodiment 2. This address 80 in the SCSI drive is constructed of the cylinder address, head address, record number, and sector number in the parity drive.

When the data determined by the corresponding SCSI drive address 72 to the DM pointer 76 is present in the cache memory 7, the cache address 81 registers the address therein with respect to the cache memory 7 for this data. If this data has been stored in this cache memory 7, the cache flag 82 is turned ON (1) in a similar manner to the address table 70. An invalidation flag is such a flag for indicating whether or not the data determined by the SCSI drive address 72 corresponding to the DM pointer 76 is valid or invalid. If this data is invalid, then the invalidation flag (1) is registered. A drive flag is such a flag for representing whether or not data has been written into a drive. When this drive flag is ON (1), it represents that this data has been written into the drive. When of this drive flag is OFF (1), it indicates that this data has not been written in this drive.

It should be noted that when the power source of the system is turned ON, the address table 70 and the dynamic address conversion table 90 are automatically read into the cache memory 7 from a specific SCSI drive 12 within the logic group 10 by the MP 20 without any control by the CPU 1. On the other hand, when the power source of the system is turned OFF, the address table 70 in the cache memory 7 is automatically stored into a predetermined place within the SCSI drive 12 which has been read, without any control by the CPU 1 by the MP 20.

(3) Preservation of Region Where Dynamic Address Conversion is Performed, and of Other Regions The process according to this embodiment will now be explained in detail.

First of all, a user sets both of a region for storing data to be dynamic-address-converted, and a region to be processed at the normal level 5 before using a disk array.

When the address conversion is dynamically performed in accordance with this embodiment, an empty region must be previously prepared. Also, if there is no empty region during the process, the replacement operation is carried out so as to preserve an empty region. As a result, in this embodiment, since such a replacement process is frequently required for the data to which access operations occur at a very high random rate, the dynamic address conversion operation is suppressed as much as possible. Accordingly, the user previously investigates a quantity of sequential data whose performance can be improved by dynamically performing the address conversion, and then sets a region where the dynamic address conversion is carried out. A setting method is such that the user would request to the ADC 2 at the initial setting stage, a region to be preserved in a form of a specific range of the CPU designation address. In the ADC 2, as shown in FIGS. 3 and 4, the MP 20 preserves a region having a dimension corresponding to such a region where the dynamic address conversion demanded by this user is carried out, with the SCSI drive 12, and the address (Addr 78 in SCSI) of the region preserved in this SCSI drive 12 is registered into a dynamic address conversion table 90. To interpose a link between one line of the address table 70 and one line of the dynamic address conversion table 90, the MP1 sets the DM pointers 70 having the same values is each other. It should be noted that the above-described CPU designation address belonging to the CPU designation range will now be called a "specific address". In case that the dynamic address conversion is carried out when a demand to write data is issued from the CPU 1 later on, the specific address belonging to the CPU designation range is designated as a write destination. Then, this CPU designation address is registered to one line where the DM pointer 76 within the address table 70 has been set. When another write demand is designated for the CPU designation address which does not belong to the CPU designation range, this CPU designation address is registered to one line of the address table 70 where the DM pointer 76 is not set. In the dynamic address conversion, not only the sequential data, but also the data to be compressed are stored into such a region where the dynamic address conversion is carried out.

The region where the dynamic address conversion is performed is distributed into regions of the same address ranges within a plurality of drives for constituting the respective logic groups 10, and then constituted. The respective regions may be constituted by a plurality of regions each having a sector unit, or a plurality of regions each having a cylinder unit. As described above, after such regions have been set, when the address (CPU designation address 71) designated by the CPU 1 is address-converted by the MP 20 by utilizing the address table 70 within the cache memory 7, the MP 20 refers to the DM pointer 76 whether or not this CPU designation address 71 corresponds to the address (specific address) of the region where the dynamic address conversion is carried out. If this CPU designation address 1 corresponds to the specific address, then a process to perform the dynamic address conversion is performed. If the CPU designation address 1 does not correspond to the specific address, then the process of the normal level 5 is carried out.

(4) Summary of Data Writing Operation

As described above, after the region where the dynamic address conversion is performed and the region for the level 5 process have been set, the following data writing process is carried out.

It is now assumed that a write command is issued from the CPU 1. First, after any one of the MP 20 in the ADC 2 has received a drive number for a CPU designation and a write command for designating write data and the CPU designation address 71 from the CPU 1, a check is made as to whether or not this MP 20 can process these commands in the respective channel paths 6 within the cluster 13 to which this MP 20 belongs. If possible, then a response "processable" is returned to the CPU 1. After the response "processable" has been received in the CPU 1, the data is transferred to the ADC 2. At this time, in the ADC 2, the channel path switch 16 connects this external interface path 4 and the interface adapter 15 with this channel path 6 in the channel path director 5 in response to the instruction of the MP 20, and establishes the connection between the CPU 1 and the ADC 2. After the connection between the CPU 1 and the ADC 2 has been established, the data transfer from the CPU 1 is accepted. In response to the instruction issued from the MP 20, the data transferred from the CPU 1 is protocol-converted by the channel interface 21, and the speed adjustment is carried out from the transfer speed at the external interface path 4 to the process speed in the ADC 2. After the protocol conversion and the speed control have been completed in the channel interface 21, the data is processed under data transfer control by the DCC 22, and is then transferred to a compression circuit 27.

As to data to be compressed, the data which has been transferred to the compression circuit 27, is compressed in response to the instruction issued by the MP 20.

The data compressed by the compression circuit 27 is transferred to a channel adapter 24, and then stored into the cache memory 7 by this adapter 24. On the other hand, the data which is not compressed is transferred to a through path within the compression circuit 27 from the DCC, and then transferred to the channel adapter 24, which will be stored into the cache memory 7 in a similar manner to the compressed data. It is preferable to employ a nonvolatile memory backed up by a battery as this cache memory 7 for storing the write data. As described above, after the MP 20 confirmed that the data has been stored into the cache memory 7, the MP 20 reports a completion of the write process to the CPU 1.

A plurality of write data are written into the cache memory 7 by repeating such an operation. In this case, a judgement is made as to whether or not the address designated for this write data belongs to the above-described specific range of the CPU designation address based upon the address table 70. Based on the judgement results, these write data are separated into a group of data to be written into the dynamic writing region, or another group of data not to be written into the dynamic writing region, and then are stored into the cache memory 7. These write data are processed for each group.

The data to be written into a region where no dynamic address conversion is carried out, will be processed as follows:

First, a judgement is made as to whether or not the addresses designated by the CPU with respect to the respective write data have been registered into the address conversion table. That is, a check is done as to whether the respective write data corresponds to write data for updating the previously written data, or the data with this address has been firstly written.

With respect to data for not updating the written data, when the number of such data reach a predetermined value, the parity generating circuit (PG) 36 generates a parity data group from these data in response to an instruction from the MP 20. The MP 20 determines an empty region to which these write data and the parity data should be written.

In other words, selection is made of such empty regions with reference to the address table 70 that belong to the above-described region in the predetermined number of drives within any of the logic groups 10, whose address within the drives are mutually equal to each other. Thereafter, the CPU designation addresses for these write data are registered in the address table 70. The drive number 77 of the recording region allocated to these write data, the address 78 within the drive, and the similar addresses 79 and 80 related to the parity data are registered in the address table 70, and a cache address 81 is registered, and then a cache flag 82 is set to ON (1).

Subsequently, these parity data groups are stored into the allocated empty regions.

When a judgement is made that the data to be written into the region where no dynamic address conversion is carried out, corresponds to data for updating the written data, as will be explained more in detail, both of this written data and the original parity data in the original parity group to which this written data belongs are read out, parity data is newly produced from these data and updating data and the original parity data are rewritten by this updating data and the new parity data. Consequently, the original parity group is rewritten, but a new parity group is not produced.

A writing operation of this case will now be explained with reference to FIG. 3.

(5) Update of Data within Region Where No Dynamic Address Conversion is Performed First, the MP 20 instructs the drive interface 28 that the written data and the parity data are read out. More specifically, in FIG. 3, when the data at the position of ADR 3 is rewritten and the CPU designation address 71 is "Drive #2", the MP 20 checks the respective items corresponding to the CPU designation address 71 (Drive #2, ADR 3) in the address table 70. In FIG. 3, since this CPU designation address has been registered, but the DM pointer 76 has not yet been registered for this address, the MP 20 judges that this data corresponds to data to be processed at the level 5, and recognizes the SCSI drive number 77 for write destination, the Addr 78 in SCSI, and the parity drive number 79 and also the Addr 80 in parity from the SCSI drive address 72 and the parity drive address 73. Then, the MP 20 instructs the drive interface 20 to read out the data before write operation which has been stored at the writing address based on this converted address, and also the SCSI drive 12 into which the parity data has been stored, to read out this data and this parity data. In two SCSI drives 12 accepting this read command from the drive interface 28, this Addr 78 in SCSI and this Addr 80 in parity are accessed, so that both of the written data and the parity data are transferred from the SCSI drive to the cache memory 7. Upon receipt of these written data, parity data, and new write data, the parity data generating circuit 36 generates new parity data after the update operation by the instruction of the MP 20. Both of the new write data and the new parity data are written into addresses at which the write data before update operation and the parity data have been stored.

(6) Write/Update Data in Region Where a Dynamic Address Conversion is Carried Out As described above, the data to be written into the region where no dynamic address conversion is carried out, is processed by the different ways, depending upon such a condition that this data corresponds to data for updating the written data.

On the other hand, data to be written into the region where the dynamic address conversion is carried out, will be processed as follows.

Such data are grouped as a new group when the quantity of these data become a predetermined number, regardless of to such a fact that these data correspond to the data for updating the written data, and are stored into an empty region in the logic group.

That is, when the number of such write data reaches a predetermined number, the parity data generating circuit 36 generates parity data from these data in response to the instruction issued from the MP 20, and generates a parity group from these write data and the generated parity data. The MP 20 determines the empty region to which these parity groups should be written. As opposed to the previous case where the dynamic address conversion is not carried out, the empty region is selected from the region belonging to the region used for the dynamic address conversion.

That is, selection is made of such empty regions whose addresses in drives are equal to each other within a predetermined number of drives for the logic group 10 with reference to the dynamic address table 90. Thereafter, the CPU designation addresses of these write data are registered into the address table 70, and furthermore, the drive number 77, the address 78 with drive, and similar addresses 79 and 80 related to the parity data of the recording regions allocated to these write data are registered into the dynamic address table 90, and also a cache address 81 is registered. Subsequently, a cache flag 82 is set to ON (1), and also the invalidation flag 91 and the drive flag 83 remain zero (OFF).

Next, these parity data groups are stored into the above-explained allocated empty regions.

If none of these write data constituting this new parity groups corresponds to data for rewriting the written data, the writing operation will be completed. If any one of these write data is to update the written data, then this written data is invalidated. Consequently, the original parity group contains partially invalidated data.

Figure 6:
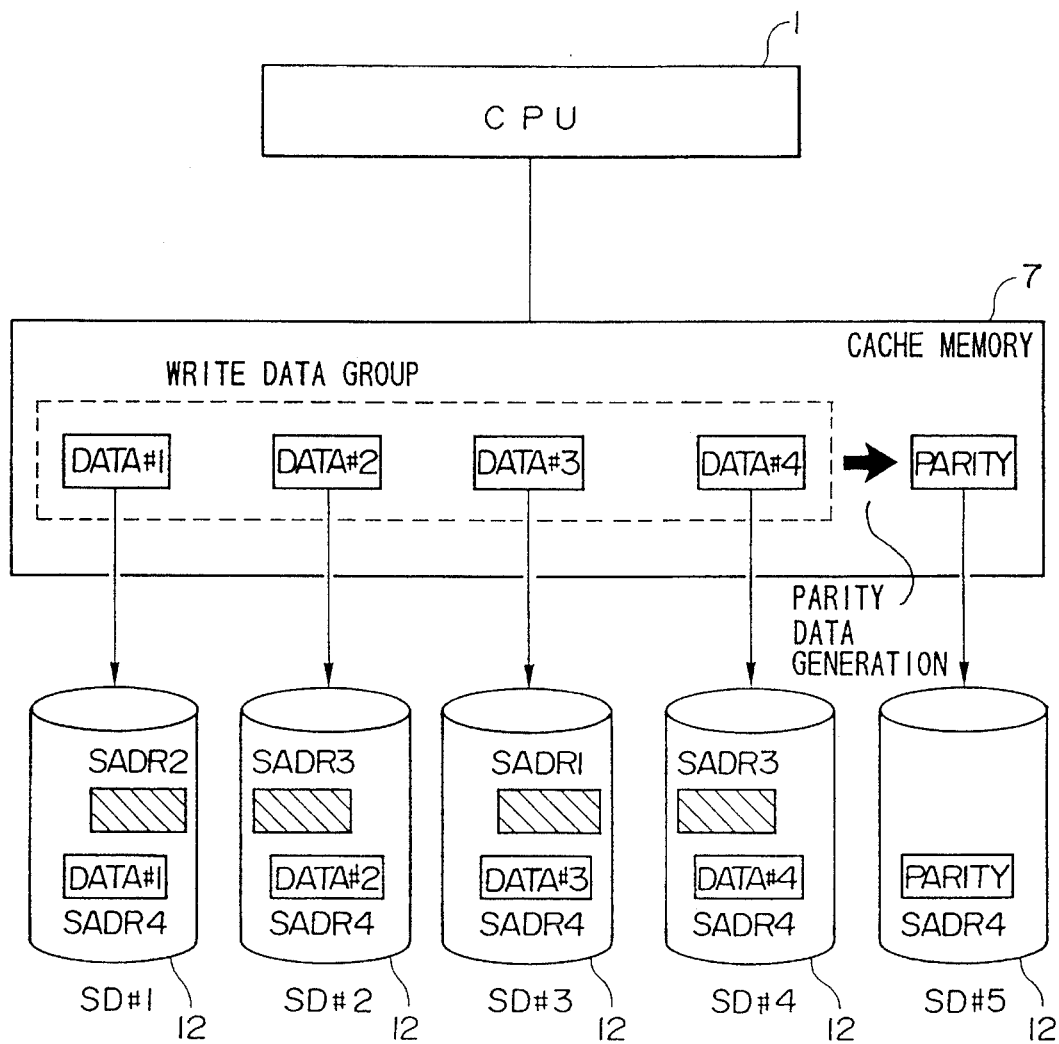
FIG. 6 is an explanation diagram for a data storage method according to the present invention.

Referring now FIG. 6, the data write operation to the region where the dynamic address conversion is performed will be described in more detail.

For example, the following case will be explained in which write commands are sequentially issued from the CPU with respect to written data #1 in the SCSI drive SD#1, written data #2, written data #3 of the SCSI drive SD#3, and written data #4 of the SCSI drive SD#4 in this order.

These data are written into the cache memory 7 by the MP 20. At this time, information about these data is registered into the address tables 70 and 90 within the cache. It should be noted that if the write data #1 to #4 before update process are held in the cache memory 7, after these old data have been rewritten in the cache memory 7, the following operation is performed.

Assuming now that the logic group 10 is constructed by 5 sets of SCSI drives 12. The MP 20 produces the parity data when four write data have been collected in the cache memory 7.

In other words, in the dynamic address conversion table 90, the MP 20 searches such a data that the invalidation flag 91 is set to OFF (0), the cache flag 83 is set to ON (1), and the drive flag 83 is set to OFF (0). The MP 20 investigates the quantity of data which can satisfy this condition, and then instructs the parity data generating circuit (PG) 36 to generate the parity data with regard to the four write data once this number reaches 4. The MP 20 writes all of these four data and the newly generated parity data as one new parity group into the logic drive in a parallel mode. To this purpose, the MP 20 first searches an address of write destination. That is, the MP 20 searches such a space in the respective SCSI drives 12 into which all of the parity data can be written. Specifically, the MP 20 searches such a region in the dynamic address conversion table 90, that the invalidation flag 91 of the Addr 78 within the same SCSI is turned ON for the SCSI drive 12 to constitute the logic group. In this case, there is no question as to whether or not the corresponding parity data is valid.

As represented in FIG. 4, in the dynamic address conversion table 90, the CPU designation addresses 71 of the data #1 to #4 have the following relationship in that the data #1 corresponds to DM a-2, the data #2 corresponds to DM b-3, the data #3 corresponds to DM c-1, and the data #4 corresponds to DM d-3.

In case of FIG. 4, assuming now that the logic group is constructed by the SCSI drives #1 to #5, in the regions for the address SADR 4 of the drive SD#1 through the drive SD#4, all of the invalidation flags 91 are turned ON, and these regions may be judged as empty regions into which the data #1 to #4 can be written.

Thus, with respect to the CPU designation address 71 (specific address) which is designated by the user as the write destination of the data #1, the MP 20 converts this specific address by the DM pointer 76 in such a manner that the data is written into the SADR 2 of the drive SD#1 at the item of DM a-2 of the dynamic address conversion table 90. However, since the dynamic address conversion is carried out, the MP 20 determines that the data is written into the SADR 4 of the SCSI drive SD#1 which has been determined to be a new write destination after the judgement was made of the write space. Similarly, the MP 20 determines that the write data #2, #3, #4 are written into the address SADR 4 of the SCSI drives SD#2 to SD#4, which are to update the data #2 at the address SADR 3 of the drive SD#2, the data #3 at the address SADR 1 of the SCSI drive 12 for the drive SD#3, and the data #4 at the SADR 3 of the drive SD#4.

As described above, after the write destination address has been determined by the MP 20, the MP 20 instructs the drive interface 28 to issue a write demand to the respective SCSI drives SD#1 to SD#5 with respect to the Addr 78 (SADR 4) in SCSI for the writable space. In the drive interface 28, in accordance with the write process sequence of the SCSI, both of the write command and the Addr 78 (SADR 4) in SCSI are issued via the drive unit path 9 to this SCSI drive. In the respective SCSI drives 12 to which the write command has issued from the drive interface 28, a seek and rotation wait operation is performed for the Addr 78 (SADR 4) in the designated SCSI, namely an access process operation is carried out. After the access process has been completed in this SCSI drive 12, the cache adapter 14 reads out the data from the cache memory 7 and transfers the readout data to the drive interface 28. The drive interface 28 transfers the data which has been transferred, to the relevant SCSI drive 12 via the drive unit path 9. When the data write operation to the Addr 78 in SCSI of this SCSI drive 12 has been completed, this SCSI drive 12 reports to the drive interface 28 that the write operation is completed. Then, the drive interface 28 reports to the MP 20 that this completion has been received. At this time, in case that this write data is not left on the cache memory 7, the MP 20 turns OFF the cache flag 82 of the address table 70 based on this report. Also with respect to the parity data, the parity data is written in accordance with the parity drive address 73 in a similar manner to the data. In case that the write address is dynamically converted in such a manner, when the drive interface 28 receives the completion report issued from the SCSI drive 12, the value of the DM pointer 76 with respect to the CPU designation address 71 which has been designated by a user of the address table 70 as a write destination, is updated into the value of the DM pointer 76 corresponding to the SCSI drive address 72 after the write operation in the dynamic address conversion table 90. At this time, the receptive items of the dynamic address conversion table 90 are updated. Specifically, in the address table 70 shown in FIG. 3, if the CPU 1 instructs to write the data #1 into the ADR1 of Drive #1, when this data #1 is dynamically address-converted in the above-described manner, since the DM pointer 76 becomes DM a-2 before the write operation, this DM pointer 76 corresponds to the address SDAR 2 of the SCSI drive SD#1. After the data #1 has been written by the dynamic address conversion, the MP 20 updates the DM pointer 76 of Drive #1 and ADR 1 of the address table 70 from DM a-2 to DM a-4. At the same time, the MP 20 turns OFF (0) the invalidation flag 91 of DM a-4, turns ON (1) the drive flag 83 in the dynamic address conversion table 90. If the write data is left in the cache memory 7, the MP 20 registers the address in the cache address 81, and the cache flag 82 is maintained at ON (1) state. When a user issues a demand to read this data in future, the previous address is not accessed, but the newly stored address is accessed.

At the same time, in the dynamic address conversion table 90, the invalidation flag 91 of the DM pointer DM a-2 before the write operation is turned ON (1), and the cache flag 82 and the drive flag 83 are turned OFF (0). This region will be used as another write space later on.

The above-explained write operations to the drive are performed in parallel in the respective SCSI drives 12 for constituting the logic group 10. The above-described write operations will also be referred to as a "lump-sum write operation".

As described above, with respect to the region where the dynamic address conversion is carried out, the write data is stored into the cache memory 7, regardless of whether or not the written data is updated by the write data, the parity data is produced by a predetermined number of write data stored in the cache memory 7, and then both the write data and the parity are written into a plurality of SCSI drives 12 in a parallel mode. No read operation of either the parity data and such data before the write operation, which has been previously stored into the write destination address designated by the user, is carried out as in the conventional data process at the level 5. As a result, the overhead occurring during the write operation can be reduced.

However, if the address would be dynamically updated and stored as to the write data, since the regions where the invalidation flag 91 is turned ON (1) are distributed, the data storage efficiency (namely, a ratio of an actually stored data amount to a data amount capable of being stored into the SCSI drives) is lowered. Furthermore, if such a condition is advanced, then there is no empty region where a batch write operation by the dynamic address conversion is carried out. With regard to this difficulty, a data replacement operation may be helpful (which will be discussed later).

It should be noted in this preferred embodiment that since the data are stored in parallel into a plurality of regions having the same addresses in drives, it is preferable to synchronize the rotations of all SCSI drives 12 within the logic group 10.

(7) Fault Recovery

In such a case that several invalidation data are present, when a fault happens to occur in a SCSI drive within the logic group 10, the data stored in this faulty SCSI drive can be recovered based upon the data and the parity data stored in the SCSI drives 12 other than the faulty SCSI drive. When such a fault recovery is performed, such data that the corresponding invalidation flag 91 within the cache memory 7 in the respective SCSI drives 12, is also read out as the valid data, which is used to recover the faulty data. The data where the invalidation flag 91 is turned ON, corresponds to the old data before the update, and has such a value when the parity data group to which this old data belonged has been produced. Consequently, this old data may be used to recover the data of the faulty drive. Accordingly, in this embodiment, when the written data is updated into the dynamic address converting region, although the invalidation flag is attached to this data, this is the reason why the data is not erased.

(8) Dynamic Address Conversion Region and Non-dynamic Address Conversion Region

First, a description will now be made of a data storage region. In this embodiment, it is assumed that an amount of data which is actually stored into a region where the dynamic address conversion in the SCSI drive 12 is carried out, is equal to 1/V of the maximum storage capacity for the dynamic address conversion region. This is because a region where a batch write operation is carried out (rewrite region) is required in order to dynamically convert the address of the write address to perform the batch write operation. That is, if the maximum write amount of the data would be stored into the region where the dynamic address conversion of the SCSI drive 12 is performed, when a write demand is issued later on, even when such a batch write operation is to be executed, there is no place into which the data is to be written. In a large-scale general purpose computer, a user reserves a usable region (capacity). When the user reads/writes data, the data read/write operation must be processed within the range corresponding to this data capacity. If the data process region exceeds this usable region (capacity), then a region (capacity) must be newly reserved. Accordingly, as previously explained, when the user sets the dynamic address conversion region by way of the CPU 1, he must reserve a spare region ((V−1)/V) used as a rewrite region in order to accept a write command which will be issued later.

The ratio of the reserved rewriting region to the usable region is given as follows. Under such a case that the dynamic address conversion is not performed only for the sequentially accessed data, but for the partially random-accessed data, as to the random data, when there are many read/write commands to access the random address, the value of 1/V is set to a small value, and when there are many read/write demands for accessing the relatively same addresses, a value of 1/V is set to be a large value. Furthermore, in the former case, the data are quickly moved from the cache memory 7 to the SCSI drives. In the latter case, conversely, it is desirable to maintain the data within the cache memory 7 as long as possible. There are two methods for change 1/V. In accordance with one method, with regard to the data previously stored by the user, the amount of the random access is recognized to determine the ratio (1/V) of the data to be stored. The user makes a judgement based upon his data characteristics, and the ratio of actually stored data within the region (capacity) reserved by himself. For instance, as to the same data, if the ratio of the sequential rewriting access to all accesses becomes approximately 30%, then it is set to 1/V=½ approximately. The user stores the data corresponding to only ½ of the region (capacity) previously reserved by him. In the other method, no user reserves a region (capacity), but the MP 20 in the ADC 2 records the history of an address accessed for a constant time, obtains the random access ratio from this address history data, and automatically allocates the ratio (1/V) of the data stored by the MP 20 in the ADC 2. For instance, when the data equal to ⅘ amount of data which can be stored into the SCSI drive 12 have been stored, and the random access ratio for this data is increased, the data is arbitrarily moved to another logic group, and the MP 20 reduces 1/V.

(9) Replacement of Partially Invalidated Parity Group

However, even if such a rewriting region is maintained, since there is a certain limitation in the capacity of the data capable of being stored into a single SCSI drive 12, when the batch writing operation is repeated, there is no rewrite region. Thus, all of the valid data present in the SCSI drives 12 are grouped and therefore a rewrite region must be newly produced. Explanation will now be made of this new method.

Figure 7:
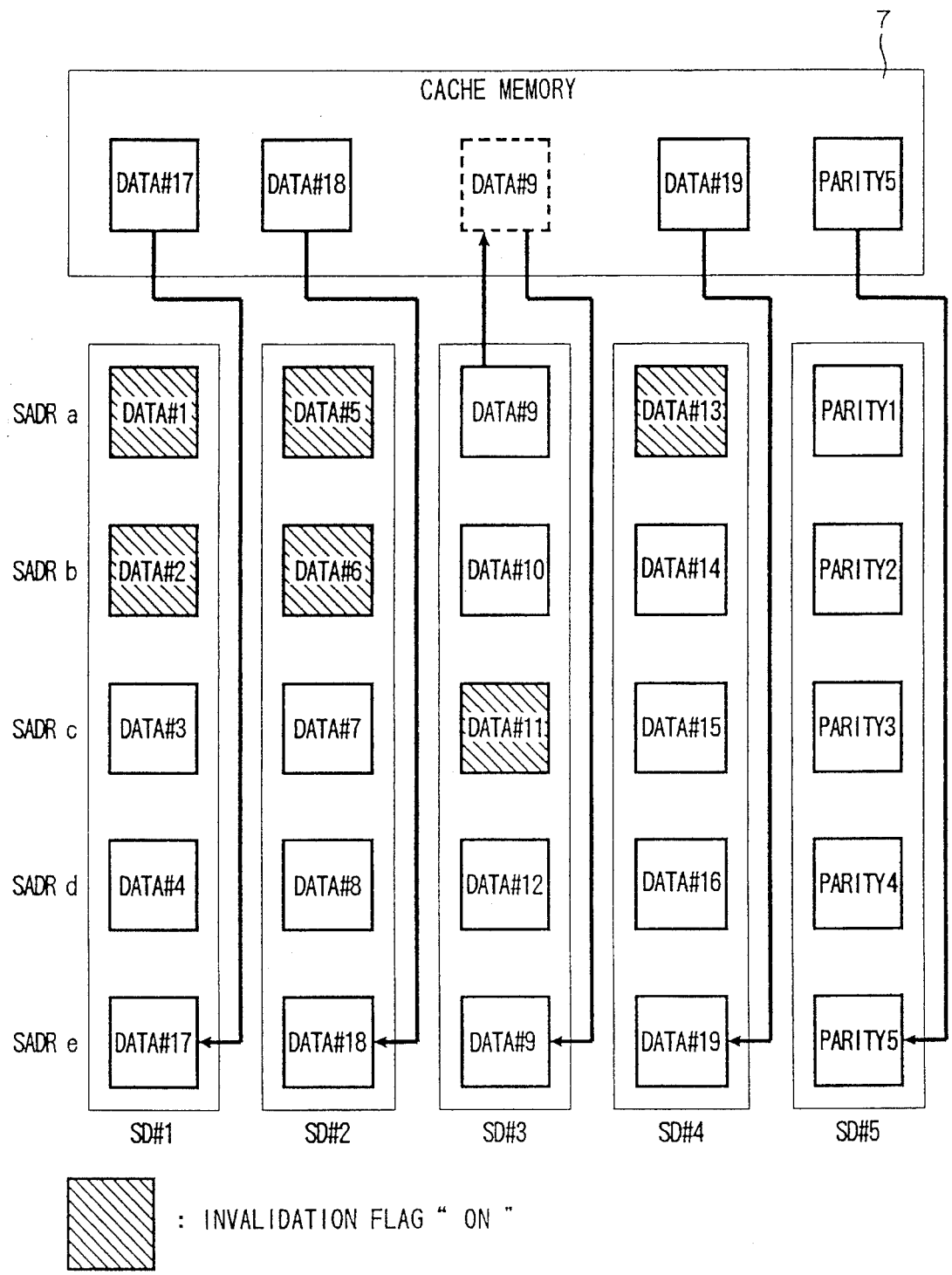
FIG. 7 is an explanation diagram for a replacement operation.

FIG. 7 is such a drawing to extract the data of the same Addr 78 in the SCSI within the respective SCSI drives 12. Parity data is produced based on the data of the same Addr 78 in the SCSI (same one row) for the respective SCSI drives 12 within the logic group 10. For instance, considering the address of SADR a, parity data #1 is formed from the data #1 of the SCSI drive #1, the data #5 of the SCSI drive #2, the data #9 of the SCSI drive #3, and the data #13 of the SCSI drive #4. In FIG. 7, the data where the invalidation flag 91 is turned OFF is only the data #9 in the data group of SADR a. As previously explained, the invalidated data #1, #5, #13 are left as the data-recovering data in the faulty disk when the fault happens to occur. As to the SADR b, the data where the invalidation flag 91 is turned OFF corresponds to two data #10 and #14. As to the SADR c, the data where the invalidation flag 91 is turned OFF corresponds to three data #3, #7, #15. As to the SADR d, the data where the invalidation flag 91 is turned OFF corresponds to all data #4, #8, #12, #16. The MP 20 continuously monitors the address table 70 and the dynamic address conversion table 90 within the cache memory 7. While monitoring the SCSI drive address 72 and the invalidation flag 91 within the dynamic address conversion table 90, the MP 20 recognizes the number of a region where the invalidation flag 91 becomes ON (1), which belongs to the same parity group, namely, corresponds to the same Addr 78 in the SCSI. If the number of this region becomes greater than a preset value, then the replacement operation is carried out. For instance, it is preset that when the number of the region where the invalidation flag 91 becomes ON (1) with respect to the same Addr 78 in the SCSI, is greater than 3, the replacement operation is carried out. Then, assuming now that SADR a of FIG. 7 is SADR 3, if three invalidation flags 91 are turned ON (1) with respect to the same Addr 78 in the SCSI, the MP 20 performs the replacement operation. Also, this replacement process may be executed in response to an instruction issued from a user.

In a specific example, the MP 20 issues a virtual read command to the valid data within this partially invalidated parity data group, namely, the data about the address SADR 3 of the drive SD#3 shown in FIG. 4, and virtually reads out this data to be stored into the cache memory 7. 4 data constructed of other write data transferred from the CPU 1, or data virtually read out from the other row in a similar manner, are combined from which parity data is newly produced, a writing empty space is searched at the same time when the dynamic address conversion is carried out, and then is stored into these regions in parallel form. It should be noted that at the stage when the data #9 is written into the cache memory 7, the MP 20 changes the cache address 81 in the address table 70 provided within the cache memory 7 and also turns ON the cache flag 82. After the data have been stored into the rewrite region, the respective items of the address table 70 and the dynamic address conversion table 90 are changed in a similar manner of the writing operation of the dynamic address conversion.

Another replacement method is as follows: As previously described, once the partially invalid parity data group can satisfy the replacement condition, the replacement operation is not immediately executed, but a read command is then issued from the CPU 1 to such data, and the replacement process is performed when the data is read out from the SCSI drive 12. In other words, this data is transferred to a host unit and simultaneously stored into the cache memory 7, parity data is newly produced from the write data, or data picked up from another row in a similar manner, and then these parity data are stored into the respective rewrite regions of the SCSI drives 12 used for storing parity data.

An initiation operation for the replacement process may be performed by the following method.

Namely, when the number of partially invalidated parity groups exceeds a predetermined limit number, the replacement process is carried out. In this case, the quantity of such parity data groups containing at least one of the invalidated data numbers is counted, and when this count value exceeds a predetermined number, the replacement process is performed. In accordance with this method, the counting operation becomes simple.

To the contrary, the quantity of parity data groups containing the invalidated data whose number exceeds a predetermined value, is counted, and if this count value exceeds a preselected number, the replacement process is initiated. According to this method, a total number of replacement operations can be restricted.

Furthermore, the replacement process may be initiated when a ratio of the capacity of the empty region to the data write capacity reserved by a user via the CPU 1 is smaller than, or equal to a predetermined value.

It should be noted that the address table 70 and the dynamic address conversion table 90 are updated in a similar manner to the data writing operation at the stage when the data is stored into the rewrite region. As described above, when all the invalidation flags 91 of the data within a row become ON, this row is handled as an empty region (rewriting region).

If the above-described replacement process (even if any one of these two methods) is performed when the number of the read/write commands issued in the logic group 10 is comparatively small, especially when the write commands are less, reduction in the read/write command processing efficiency may be suppressed.

(10) Data Readout

When the MP 20 recognizes a read command, the MP 20 refers to the address table 70 based upon the CPU designation address 71 (drive number 74 and CCHHR 74), and judges whether or not this address has been dynamically converted by checking whether or not the DM pointer has been registered to this address. If no dynamic address conversion is carried out, then the address conversion of this data to the SCSI drive address 72 is continuously performed based on the address table 70. At the same time, the MP 20 checks the cache flag 82 of the address table 70 to judge whether or not this relevant data is present in the cache memory 7. On the other hand, when the dynamic address conversion has been performed and the address has been registered into the DM pointer 76 of the address table 70, the address conversion is performed by way of the dynamic address conversion table 90. It should be noted that the address in the drive where the invalidation flag is turned OFF is utilized. As a consequence, even when the CPU designation address has been registered into a plurality of tables 90, the data which has been written very recently can be read out.

In case of a cache hit, the MP 20 converts the CPU designation address 71 (drive number 74 and CCHHR 75) designated by the CPU 1 into the address (cache address 81) of the cache memory 7 based on either the address table 70, or the dynamic address conversion table 90, and then reads out this data from the cache memory 7. In a specific example, under instruction by the MP 20, this data is read out from the cache memory 7 by a cache adapter circuit 24. The cache adapter circuit 24 is a circuit for reading/writing the data from the cache memory 7 in response to an instruction by the MP 20, and for performing an exclusive control to the monitoring of the conditions of the cache memory 7, the read demand, and the write demand. Since the data which has been compressed by the compression circuit 27 is stored into the cache memory 7, the data read by the cache adapter 24 is transferred to the compression circuit 27. The data which is not compressed may pass directly through the compression circuit 27. To the contrary, the data which has been compressed is expanded to the original data which had been transferred from the CPU 1 to the compression circuit 27. Under control of the data control circuit (DCC) 22, the data which has passed through the data compression circuit 27, is transferred to the channel interface circuit 21. In the channel interface circuit 21, the data is converted into the protocol of the channel interface in the CPU 1, and the speed is controlled in accordance with the speed of the channel interface. After this protocol conversion and the speed control, the channel path switch 16 selects the external interface path 4 in the channel path director 5, and the data is transferred by the interface adapter 15 to the CPU 1.

On the other hand, in case of a cache mishit, the MP 20 instructs the drive interface 28 to issue a read command to this drive 12 in accordance with the SCSI drive address 72. In the drive interface 28, the read command is issued via the drive unit path 9-1 or 9-2 in accordance with the process sequence of the SCSI interface. In the relevant drive 12 where the read command has been issued from the drive interface 28, the seek and rotation wait access process to the address in the designated SCSI drive (Addr 78 in SCSI) is performed. After the access process has been completed in this drive 12, this drive 12 reads this data and transfers the read data via the drive unit path 9 to the drive interface 28. In the drive interface 28, the transferred data is further sent to the cache adapter circuit 14 provided at the drive side. Then, the data is stored into the cache memory 7 in the cache adapter 14. At this time, this cache adapter 14 reports to the MP 20 that the data is stored in the cache memory 7. The MP 20 turns ON the cache flag 82 corresponding to the CPU designation address 71 at which the user of the address table 70 or the dynamic address conversion table 90 has issued the read command based on this report, and updates the address in the cache memory 7 as follows. With respect to the drive number and CCHHR which have been designated from the CPU 1 as the address of the read command destination, the CPU designation address 71 (drive number 74 and CCHHR 75) within the address table 70 is searched, and then the address in the cache memory 7 into which this data is stored is written into the cache address 81. At the same time, the cache flag 82 is turned ON. The data is stored in the cache memory 7, the cache flag 82 of the address table 70 or the dynamic address conversion table 90 is turned ON. After the address in the cache memory 7 has been updated, this data is transferred to the CPU 1 in a similar sequence to that of the cache hit.

(11) Modifications

In this embodiment, the unit for producing the parity data is selected to be the same address (all of cylinder address, head address and record address are equal to each other with respect to the respective SCSI drives 12 for constituting the logic group 10). However, to increase the data storage efficiency, no limitation is made of such address, but if the distances from the index are equal to each other (namely, the record addresses are equal to each other), the parity data may be produced even when the cylinder addresses and the head addresses are different from each other. With such a modification, the operations of this embodiment can be realized.

(12) Conclusions of Embodiment 1

As previously described, in accordance with this embodiment, in case that the data is written into the region where the dynamic address conversion is carried out, the parity data is produced from a plurality of write data, the parity data group is generated from these write data and the produced parity data, and the resultant data are written into the empty region. This writing operation may be applied to such a case that the respective write data correspond to such data for updating the written data.

In the writing operation based on the conventional RAID at the level 5, both of the written data and the parity data corresponding to the written data are read out from the drive, new parity data is produced from these data and the updating data, and then this newly produced parity data and the updating data are written into the region where the old parity data has been held, and the region where the old write data has been held. To read the old data from these two regions and write the new data into these regions, the waiting time for waiting the rotations of the drives becomes large, thus increasing the overhead.

In accordance with this embodiment, the reading operation of the old data from the drive and the writing operation of the new data into the drive are no longer required, which were required in the conventional writing method, because of the above-described writing method. As a result, the above-explained increase in overhead never occurs.

Furthermore, according to this embodiment, when a portion of the plural data for constituting a certain one parity data group is rewritten, none of these data of this parity data group is read out from the drive. In other words, the rewritten data is handled as invalidated data, and other data are stored into the drive as valid data. As a result, the process time required for rewriting a portion of data is decreased.

Moreover, in accordance with this embodiment, the lengths of the plural data for constituting one parity group are equal to a constant length of data sent from the host unit. As a result, even if the data within any of the parity groups is partially invalidated, there are great possibilities that all of the data present in this parity data are invalidated. Thus, the region which is completely invalidated, is not required to be replaced as the empty region, but may be directly utilized. Accordingly, there are few parity groups partially invalidated, as compared with the parity data constructed of the longer data. As a result, the number of parity groups which is partially invalidated and requires the replacement process becomes low.

In addition, according to this embodiment, since the length of the plural data for constituting one parity group is equal to the constant length of the data sent from the host unit, the dimension of the region within the cache memory may be made small, which temporarily holds the plural write data transferred from the host unit for a time period during which the parity data group is constructed by these write data.

(Embodiment 2)

In this embodiment 2, to the ADC 2 shown in FIG. 1, such a function is added that a judgement is independently made by the ADC 2 whether or not the dynamic address conversion is performed based upon the attribution of the data. In this embodiment, the MP 20 of the ADC 2 makes independently a judgement that the sequential data is stored into the region where the dynamic address conversion is performed. In the previous embodiment 1, the MP 20 converts the address 71 designated by the CPU 1 (CPU designation address) into the SCSI drive address 72 for-the SCSI drive 12 which actually reads or writes the data based on the address table 70 or the dynamic address conversion table 90. During the writing operation, after such an address conversion, the data sent from the CPU 1 is once stored into the cache memory 7. Thereafter, this data is held in the cache memory until this data is taken out in accordance with the replace algorithm inherent to the cache memory.

In this embodiment 2, all of write data are once stored into the cache memory 7 and held therein for a predetermined time period. This time period for holding the data in the cache memory 7 may be previously set for the AD 2 by a user, and is controlled by the MP 20 in the ADC 2. As will be discussed later, as to the data held in the cache memory 7, the CPU designation address 71 is compared with the CPU designation address 71 for the write demand which will be issued later. The judgement is made as to whether or not these data belong to the sequential data. The data belonging to the sequential data is stored into the region where the dynamic address conversion is performed under control of the MP 20.

Then, a method for judging whether or not data belongs to the sequential data in the MP 20 will now be represented. During the write operation, after the data has been stored from the CPU 1 into the cache memory 7, the MP 20 refers the address conversion table in the cache memory 7 with respect to the CPU designation address 71 sent from the CPU 1. As shown in FIG. 3, in this embodiment, access flags 84 are set to the respective CPU designation addresses 71 of the address table 70. This access flag 84 is turned ON (1) by the MP 20 during the write operation with respect to the CPU designation address 71 designated by the CPU 1, after the write data has been stored into the cache memory 7. After a predetermined time designated by a user has passed, the access flag 84 is turned OFF (0) by the MP 20 when the data is stored from the cache memory 7 to the SCSI drive 12.

During the write operation, with regards to the CPU designation address 71 designated by the CPU 1, the MP 20 investigates such a CPU designation address 71 that the access flag 84 is turned ON (1) at the address table 70, and a comparison is performed between the CPU designation address 71 designated by the CPU 1 and this CPU designation address 71 at which the access flag 84 is turned ON (1) in the address table 70. Specifically, the drive number is compared with the cylinder address (CC) of the CCHHR 75. While the CPU designation address 71 of the data (access flag 84 is turned ON (1)) stored in the cache memory 7 and previously issued is compared with the CPU designation address 71 of the write command issued later, if the drive numbers 71 are coincident with each other and furthermore the cylinder addresses of the CCHHR 75 are coincident with each other, these write processes are judged as the sequential process. As described above, the MP 20 judges whether or not the write process corresponds to the sequential process as to the issued write demand data for a constant time period preset by a user. In case of the sequential data, the MP 20 independently controls that the sequential data are written into the region where the dynamic address conversion of this SCSI drive 12 is performed with respect to the group of such sequential data. In a specific example, both of the address table 70 and the dynamic address table 90 are registered in a similar manner to that of the preferred embodiment 1, and the write process for this SCSI drive 12 is carried out from the cache memory 7.

(Embodiment 3)

Figure 8:
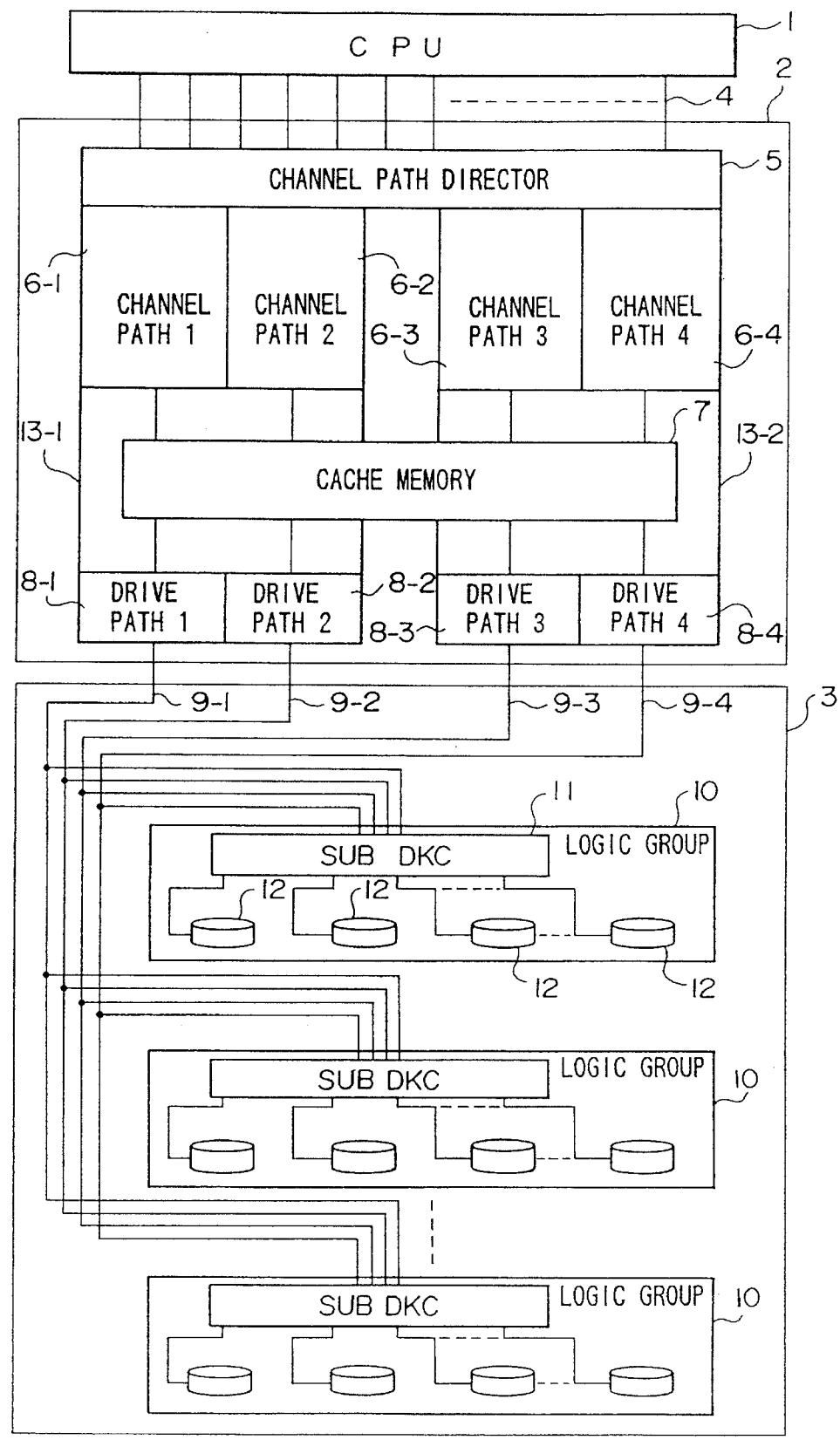
FIG. 8 schematically shows a overall arrangement of a disk array system according to a third embodiment of the present invention.
Figure 9:
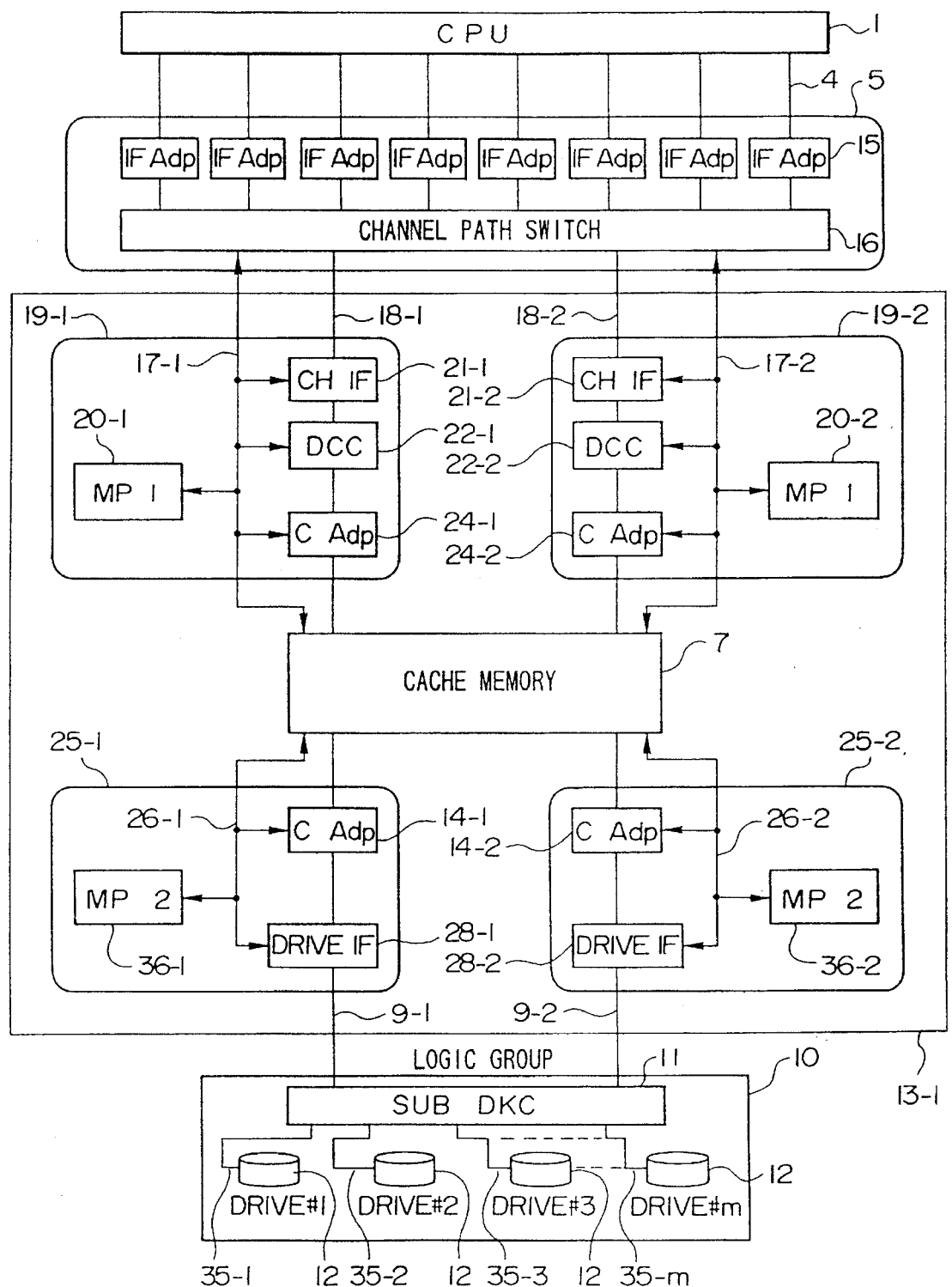
FIG. 9 schematically indicates an internal arrangement of a cluster of the third embodiment.
Figure 10:
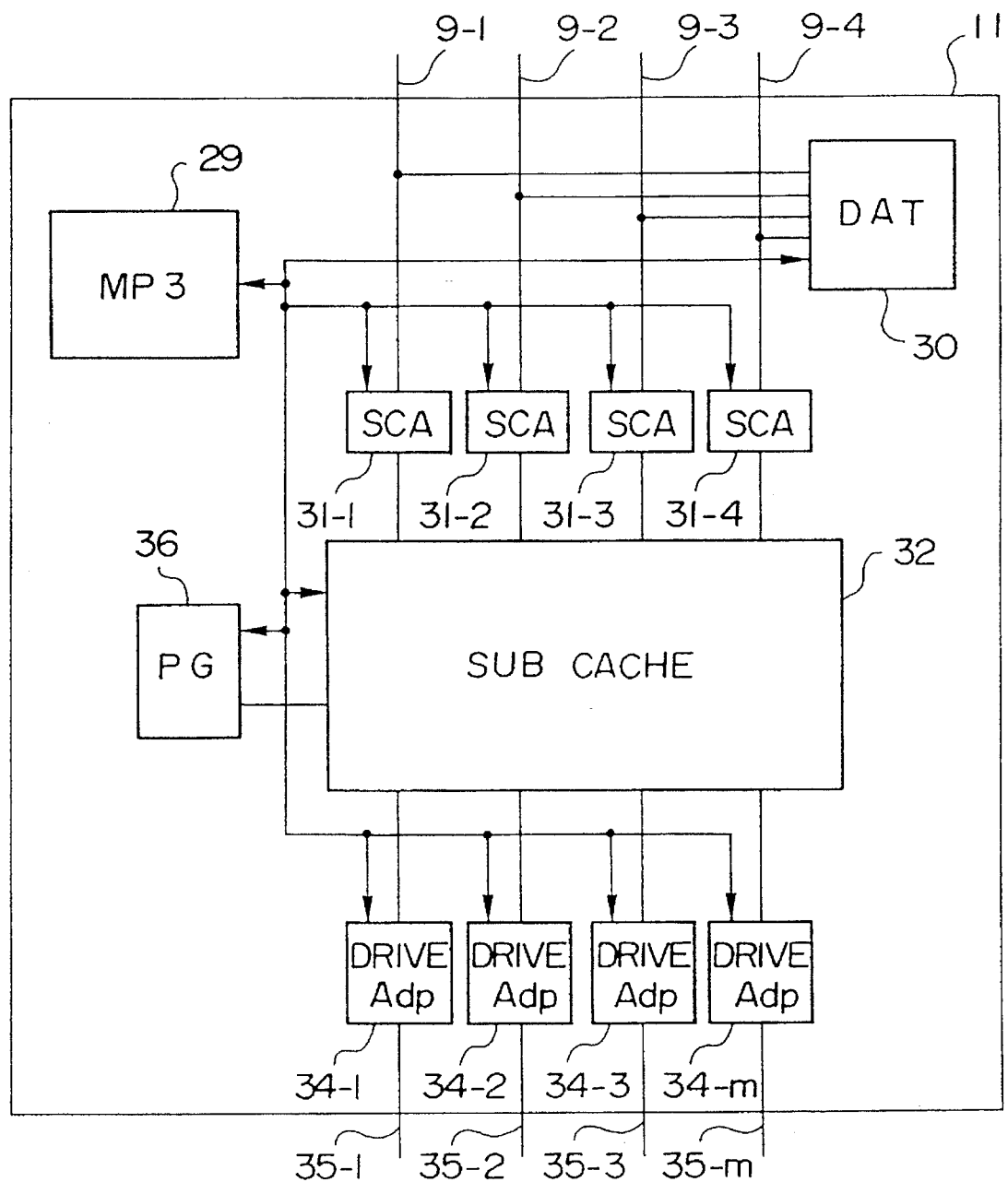
FIG. 10 schematically denotes an internal arrangement of a sub DKC shown in FIG. 9.
Figure 11:
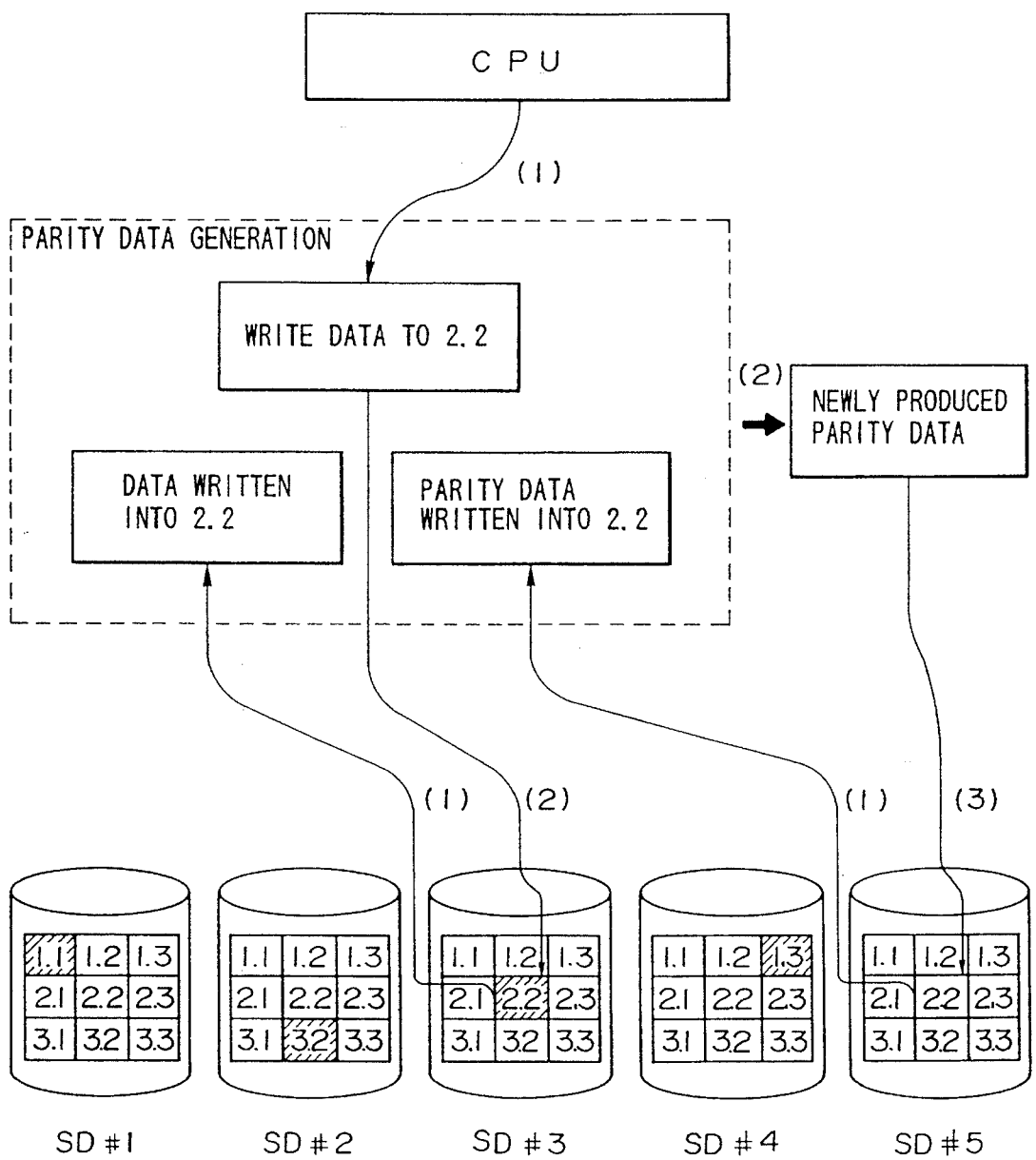
FIG. 11 is an explanatory diagram of the conventional disk array.
Figure 12:
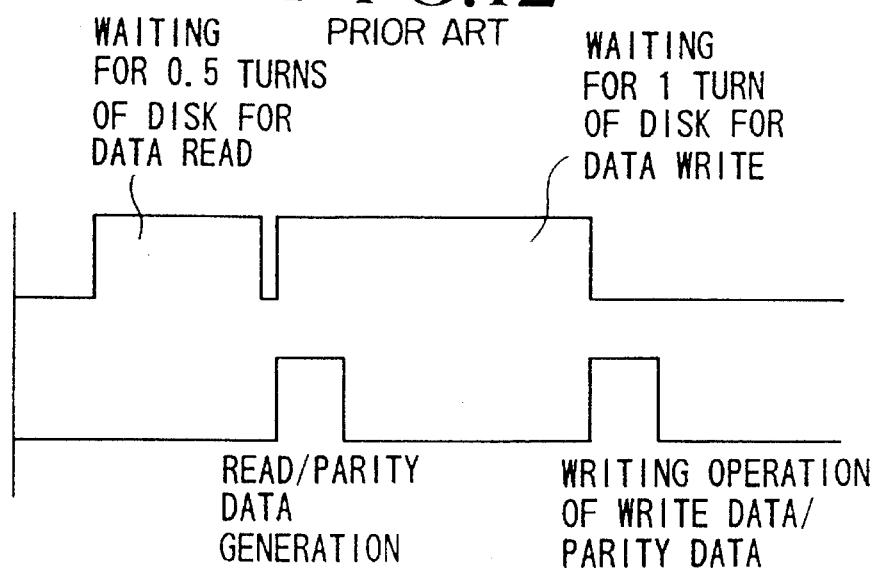
FIG. 12 is an explanatory diagram for the conventional write time.

In this embodiment 3, as shown in FIG. 8, sub DKC 11 are employed in the unit of logic group 10, and both of the address table 70 and the dynamic address conversion table 90 within the cache memory 7 as shown in the embodiments 1 and 2 are owned inside the sub DKC 11. Referring now to FIGS. 9 and 10, only different process sequences of the data process sequence in this embodiment 3 from those of the embodiments 1 and 2 will be explained. In this embodiment, as shown in FIG. 10, the address table 70 and the dynamic address conversion table 90 employed in the cache memory 7 indicated in the embodiments 1 and 2 are subdivided into a data address table (DAT) 30 within the sub DKC 11 in the unit of the respective logic groups 10. The table format stored therein and the function similar to those of the embodiments 1 and 2. However, there is such a different point that the address conversion table is stored in an exclusive memory different from the memory for storing the write/read data. A group address table (GAT) 23 as indicated in FIG. 5 has been stored in the cache memory 7 of the ADC 2. The MP 20 judges which logic group 10 in the ADC 3 the location designated by the CPU designation address 71 pertains to, with reference to the GAT 23.

When the read command is transferred from the CPU 1, the MP 20 defines the logic group 10 in the GAT 23 by the CPU designation address 71 designated by the CPU 1, and this MP 20 instructs the drive interface 20 to issue the read command to this logic group 10. Upon receipt of the instruction from the MP 20, the drive interface 20 issues the read demand to the sub DKC 11 of this logic group 10. In this sub DKC 11, a microprocessor MP 29 accepts this read command, and defines both of the SCSI drive address 72 and the parity drive address 73 with respect to the CPU designation address 71 within the logic group 10 where this data has been stored in a similar process manner that the MP 20 shown in the embodiment 1 has processed with employment of the address table 70 and the dynamic address table 90 with reference to the DAT 30. After this address has been defined, the MP 29 issues the read command to the relevant SCSI drive 12 in a similar manner to the process by the MP 20 in the embodiment 1. In the SCSI drive 12 for receiving the read command issued from the MP 29, the seek and rotation waiting operation is performed. When this data can be read, this data is transferred to the drive adapter circuit 34, and the drive adapter 34 stores this data into a sub cache memory 32. After the relevant data has been stored into the sub cache memory 32, the drive adapter 34 reports to the MP 29 that the data storage is completed, the MP 29 turns ON (1) this cache flag 82 corresponding to the CPU designation address 71 in the DAT 30 in a similar manner to that of the MP 20 in the embodiment 1, and then the address stored in the sub cache 32 is registered at the cache address 81. Subsequently, when either the read command, or the write command is issued to the data whose cache flag 82 is turned ON, a process is performed in the sub cache 32. When the update operation of the DAT 30 is accomplished by the MP 29, the MP 29 answers to the Drive IF 28 in the ADC 2 that the data can be transferred. Upon receipt of such a report, the Drive IF 28 reports it to the MP 20. Then, when the MP 20 receives this report, if the data can be stored into the cache memory 7, then this MP 20 instructs the Drive IF 28 that the data is transferred from the DKC 11.

Upon receipt of the instruction from the MP 20, the Drive IF 28 issues the read command to the MP 29 of the sub DKC 11. In response to this read request, the MP 29 instructs a sub cache adapter circuit (SCA) 31 to read this data from the sub cache 32, and this SCA 31 actually reads the data to be transferred to the Drive IF 28. After the data has been accepted by the Drive IF 28, the process shown in the embodiments 1 and 2 is performed.

On the other hand, during the write operation, the relevant logic group 10 is defined in a similar manner to that of the read operation, and the write command is issued to the MP 29 of this logic group 10. After the write command is accepted and the write data is stored into the sub cache 32, the data to be dynamically address-converted is dynamically address-converted as shown in the embodiments 1 and 2, and the address-converted data is written into the drive 12. If no dynamic address conversion is performed, then the process at the level 5 is carried out. It should be noted in this embodiment 3 that the PG 36 produces the parity data with respect to the data stored into the sub cache 32 within the sub DKC 11. As described above, in the sub DKC 11, both of the address management and the data process at the drive 12 are performed, so that a load dispersion is achieved.

It should be understood that although the sub DKC 11 are attached to the respective logic groups 10 in FIG. 8, a single sub DKC 11 may manage a plurality of logic groups 10. As described above, the sub DKC 11 are grouped to the plural logic groups 10, so that the DAT 30 can be entirely managed.

Also, the descriptions of the embodiments 1 and 2 are made of the magnetic disks. Alternatively, other types of storage devices such as an optical disk and a floppy disk may be employed.

While the present invention has been described in detail, if such a method for writing into the empty region in the drives, the parity group containing a plurality of write data and the parity data produced from the plural write data, is employed, then the data rewriting operation can be performed at a higher speed than that of the conventional data rewriting operation.

Further, according to the present invention, the process time required in the data rewriting operation can be shortened when a portion of plural data constituting a certain parity group is rewritten, the rewritten data is invalidated, and the remaining data are held in the drives as the valid data.

Moreover, in accordance with the present invention, if the lengths of the plural data for constituting a single parity group is set to be equal to the lengths of the data sent from the host unit, even when the data contained in any one of the parity groups are partially invalidated, the number of parity groups maintained under partial invalidation becomes lower than that of parity groups in which the parity data is constructed from the data longer than the invalidated data. Consequently, the quantity of parity groups which are partially invalidated and require the replacement operation is reduced. Therefore, the data to be replaced becomes small. In addition, the dimension of the region within the cache memory which is employed to temporarily hold a plurality of write data transferred from the host unit for a time period during which the parity group is arranged by these write data, may be made small.

Many different embodiments of the present invention may be constructed without departing from the spirit and scope of the invention. It should be understood that the present invention is not limited to the specific embodiments described in this specification. To the contrary, the present invention is intended to cover various modifications and equivalent arrangements included within the spirit and scope of the claims.

What is claimed is:

1. A data writing method for a disk array system including a plurality of disk drives and a cache memory for temporarily holding a plurality of write data, said plural write data including either of data each having a predetermined data length to be newly written into said plurality of disk drives and data each having said predetermined data length for updating data which have previously been written into said plurality of disk drives, said plurality of write data having been transferred from at least one host unit, said data writing method comprises the steps of:

(a) deriving, from said plural write data held in said cache memory, as data used to constitute an error correcting data group, the write data equal in number to a predetermined number and each having said predetermined data length, and producing error correction data from said derived write data equal in number to said predetermined number;

(b) writing in parallel both of the write data having said predetermined number and said error correction data, as a single error correcting data group, into a plurality of empty regions belonging to mutually different drives of said plurality of drives; and (c) invalidating data written into said plurality of disk drives for which said write data having said predetermined number includes the update data.

2. A data writing method as claimed in claim 1, further comprising the step of:

(d) executing said steps (a) to (c) every time an amount of said write data transferred from said at least one host unit satisfies a required amount of said write data, each having a constant length and said predetermined number, which are derived.

3. A data writing method as claimed in claim 1, wherein said production of the error correction data comprises the steps of:

holding one piece of said write data in a cache storage when said one piece of said write data is transferred from said one host unit;

executing said production of the error correction data when said one piece of the write data is transferred from said one host unit and an amount of write data held in said cache storage satisfies a required amount of the write data having said predetermined length and has a quantity equal to said predetermined number, without waiting for other write data to be transferred from said at least one host unit to said cache storage; and executing said production of the error correction data, when said one piece of the write data is transferred from said one host unit and an amount of the write data held in said cache storage does not satisfy the required amount of the write data having said constant length and have a quantity equal to said predetermined number, after the number of said write data held in said cache storage has reached said predetermined number.

4. A data writing method as claimed in claim 1, further comprising the steps of:

(d) repeating said steps (a) to (c) with respect to all other write data held in said cache storage; and (e) using a plurality of regions within said plurality of drives which have held said write data and said error correction data belonging to said error correcting data groups as empty regions, to write any of other error correcting data groups therein.

5. A data writing method as claimed in claim 1, wherein when a data write region is reserved in accordance with a demand issued from a user, decision is made as to whether or to said data write region corresponds to such a region where a dynamic address conversion is carried out in response to an instruction of the user, and thereafter when data to be written into said region is transferred from said at least one host unit, when a decision is made that said data write region is the region where the dynamic address conversion is performed, said steps (a) to (d) are executed.

6. A fault recovering method for a disk array system including a plurality of disk drives and a cache memory for temporarily holding a plurality of write data, said plurality of write data including either of data each having a predetermined data length to be newly written into said plurality of disk drives and data each having said predetermined data length for updating data which have previously written into said plurality of disk drives, said plurality of write data having been transferred from at least one host unit, said fault recovering method comprises the steps of:

(a) deriving, from said plural write data held in said cache memory, as data used to constitute an error correcting data group, the write data equal in number to a predetermined number and each having said predetermined data length, and producing error correction data from said derived write data equal in number to said predetermined number;

(b) writing in parallel both of the write data having said predetermined number and said error correction data, as a single error correcting data group, into a plurality of empty regions belonging to mutually different drives of said plurality of drives;

(c) invalidating data written into said plurality of disk drives for which said write data having said predetermined number includes the update data;

(d) repeating said steps (a) to (c) for other write data held in said cache storage; and (e) when a fault occurs in one of said plurality of drives, selectively recovering each of a plurality of valid data among a plurality of data held in said one drive by employing both of said error correction data and a plurality of other data, valid or invalid, which are held by drives other than said one drive, and which belong to the error correcting data groups to which said data belong.

7. A fault recovering method as claimed in claim 6, further comprising the step of:

(f) using a plurality of regions within said plurality of drives which had held said write data and the error correction data belonging to said error-correcting group as empty regions utilized to write the data belonging to other error-correcting data groups when, as a result of executing said step (c) with respect to one of said write data before said fault occurs, all of the write data belonging to the error correcting data groups to which any one of these data handled as the invalidated data at said step (c) belongs become invalidated data.

8. A fault recovering method as claimed in claim 6, wherein said recovering step is performed by the steps of:

selectively reading out both of said plurality of other write data, valid or invalid, and said error correction data from the drives other than said one drive among said plurality of drives; and recovering said one valid data based on said read written data and said read error correction data.

9. A data writing method for a disk array system including a plurality of disk drives and a cache memory for temporarily holding a plurality of write data, said plurality of write data including either of data each having a predetermined data length to be newly written into said plurality of disk drives and data each having said predetermined data length for updating data which have previously been written into said plurality of disk drives, said plurality of write data having been transferred from at least one host unit, said data writing method comprises the steps of:

(a) deriving, from said plurality of write data held in said cache memory, as data used to constitute an error correcting data group, the write data equal in number to a predetermined number and each having said predetermined data length, and producing error correction data from said derived write data equal in number to said predetermined number;

(b) writing in parallel both of the write data having said predetermined number and said error correction data, as a single error correcting data group, into a plurality of empty regions belonging to mutually different drives of said plurality of drives;

(c) invalidating data written into said plurality of disk drives for which said write data having said predetermined number includes the update data;

(d) replacing said steps (a) to (c) for other write data held in said cache memory; and (e) replacing a plurality of valid write data contained in a plurality of error-correcting data groups (partially invalidated error-correcting data groups) having at least one piece of valid write data and at least one piece of invalidated write data, said replacing step comprising the steps of:

(e1) selectively reading from said plurality of drives at least one piece of valid write data contained in the partially invalidated error-correcting data groups, and holding at least one piece of readout valid write data into the cache memory;

(e2) executing said step (e1) for other partially invalidated error-correcting data groups:

(e3) newly producing error correction data with respect to a new set of valid write data equal in number to said predetermined number, said new set of valid write data having been held in said cache memory and having been selected from a plurality of valid write data, and also said new set of valid write data, thereby generating a new error-correcting data group;

(e4) writing said newly produced error-correcting data group into the empty regions in said plurality of drives;

(e5) repeating said steps (e3) and (e4) for other new error-correcting data groups; and (e6) using a plurality of regions which hold all of the valid write data contained in a plurality of partially invalidated error-correcting data groups, all of said valid write data being rewritten by said steps (e4) and (e5), as empty regions for writing other error-correcting data groups.

10. A data writing method as claimed in claim 9, wherein said step (e1) or (e2) is selectively performed with respect to a plurality of partially invalidated error-correcting data groups under a specific condition.

11. A data writing method as claimed in claim 10, wherein said steps (e1) and (e2) are performed for any one of the error-correcting data groups every time said any one of the error-correcting data groups reaches said specific condition.

12. A data writing method as claimed in claim 10, wherein said steps (e1) and (e2) are performed in response to a read command transferred from any one of said at least one host unit for the valid write data belonging to any one of the error-correcting data groups under the specific condition, with respect to said demanded write data.

13. A data writing method as claimed in claim 10, wherein said steps (e1) and (e2) are selectively performed for a plurality of partially invalidated error-correcting data groups when a ratio of a capacity of the empty regions to a capacity of the regions for writing data contained in said plurality of drives has reached a predetermined limit ratio.

14. A data writing method as claimed in claim 10, wherein said steps (e1) and (e2) are selectively performed for a plurality of partially invalidated error-correcting data groups when a capacity of the empty regions within the region for writing the data contained in said plurality of drives has reached a predetermined limit value.

15. A data writing method as claimed in claim 10, wherein said specific condition is that the number of invalidated write data contained in the partially invalidated error-correcting data groups is greater than or equal to a predetermined limit number.

16. A data writing method as claimed in claim 10, further comprising a step of:

when new write data is transferred from said at least one host unit, writing said new write data into said cache memory;

wherein said step (e3) further includes a step for producing an error-correcting data group containing write data equal in number to said predetermined number and having new write data and the write data read out at said step (e1) when said new write data transferred from any one of said at least one host unit is present in said cache memory.

17. A data writing method as claimed in claim 16, wherein said steps (e1) and (e2) are carried out when the number of said plurality of partially invalidated error-correcting data groups reaches a predetermined number, with respect to said plurality of partially invalidated error-correcting data groups.

18. A data writing method for a disk array system including a plurality of disk drives and a cache memory for temporarily holding a plurality of write data, said plurality of write data including either of data each having a predetermined data length to be newly written into said plurality of disk drives and data each having said predetermined data length for updating data which have previously been written into said plurality of disk drives, said plurality of write data having been transferred from at least one host unit, said data writing method comprises the steps of:

a) deriving, from said plural write data held in said cache memory, as data used to constitute an error correcting data group, the write data equal in number to a predetermined number and each having said predetermined data length, and producing error correction data from said derived write data equal in number to said predetermined number;

(b) writing in parallel both of the write data having said predetermined number and said error correction data, as a single error correcting data group, into a plurality of empty regions belonging to mutually different drives of said plurality of drives;

(c) invalidating data written into said plurality of disk drives for which said write data having said predetermined number includes the update data;

(d) repeating said steps (a) to (c) for other write data held in said cache memory; and (e) replacing a plurality of valid write data contained in a plurality of error-correcting data groups (partially invalidated error-correcting data groups) having at least one piece of valid write data and at least one piece of invalidated write data;

(e1) selectively reading out said write data from said plurality of drives, transferring said readout write data to said one host unit and also holding said readout write data into the cache memory in response to a read command with respect to valid write data which has been transferred from any one of said at least one host unit and is contained in any one of partially invalidated error-correcting data groups;

(e2) executing said step (e1) for other partially invalidated error-correcting data groups;

(e3) newly produced error correction data with respect to a new set of write data equal in number to said predetermined number, said new set of write data having been held in said cache memory and having been selected from a plurality of valid write data, and also said new set of valid write data, thereby generating a new error-correcting data group;

(e4) writing said newly produced error-correcting data group into the empty regions in said plurality of drives; and (e5) invalidating the write data which is held in said plurality of drives and is such a write data before being rewritten when the write data read by said step (e1) or (e2) is rewritten by said step (e4).

19. A data writing method as claimed in claim 18, wherein said steps (e3) and (e4) are executed when a partially invalidated error-correcting data group to which the write data read out at either of said steps (e1) and (e2) belongs is under a specific condition.

20. A data writing method as claimed in claim 19, wherein said specific condition is such a condition that the number of invalidated write data contained in the partially invalidated error-correcting data groups is greater than or equal to a predetermined limit number.

21. A data writing method for a disk array system including a plurality of disk drives and a cache memory for temporarily holding a plurality of write data, said plurality of write data including either of data each having a predetermined data length to be newly written into said plurality of disk drives and data each having said predetermined data length for updating data which have ben previously been written into said plurality of disk drives, said plurality of write data having been transferred from at least one host unit, said data writing method comprises the steps of:

(a) deriving, from said plural write data held in said cache memory, as data used to constitute an error correcting data group, the write data equal in number to a predetermined number and each having said predetermined data length, and producing error correction data from said derived write data equal in number to said predetermined number;

(b) writing in parallel both of the write data having said predetermined number and said error correction data, as a single error correcting data group, into a plurality of empty regions belonging to mutually different drives of said plurality of drives;

(c) invalidating data written said plurality of disk drives for which said write data having said predetermined number includes the update data;

(d) repeating said steps (a) to (c) for other write data held in said cache memory; and (e) replacing a plurality of valid write data contained in a plurality of error-connecting data groups (partially invalidated of error-correcting data groups) having at least one piece of valid write data and at least one piece of invalidated write data;

said replacing step comprising the steps of:

(e1) selectively reading form said plurality of drives, at least one piece of valid write data contained in at least one partially invalidated error-correcting data group, and holding at least one piece of readout valid write data into the cache memory;

(e2) when new write data is transferred from any one of said at least one host unit, temporarily storing said write data into said cache memory;

(e3) selecting from a plurality of write data which have been stored into said cache memory by said step (e1) or (e2) a new set of write data equal in number to said predetermined number, newly producing error correction data with regard to the set of said write data group;

(e4) rewriting said newly produced error-correcting data group into the empty regions in said plurality of drives; and (e5) when the write data read out by said step (e1) is rewritten by said step (e4), invalidating data which have been stored into said plurality of drives.

22. A data writing method as claimed in claim 21, wherein said step (e1) includes a step for reading all of the valid data included in any one of the partially invalidated error-correcting data groups.

23. A data writing method as claimed in claim 22, wherein said steps (e3) and (e4) are executed when the partially invalidated error-correcting data groups to which the write data read by either of said steps (e1) and (e2) belongs are under the specific condition.

24. A data writing method as claimed in claim 23, wherein said specific condition includes that the number of invalidated write data contained in the partially invalidated error-correcting data groups being greater than or equal to a predetermined limit number.

25. A disk array system having a plurality of disk drives, comprising:

(a) a cache memory for holding a plurality of write data transferred from at least one host unit, said plurality of write data including either of data having a predetermined length to be newly written into said plurality of disk drives and data for updating data having predetermined length already written into said plurality of disk drives;

(b) a circuit for deriving, from said plurality of write data held in said cache memory, as data used to constitute an error correcting data group, the write data equal in number to a predetermined number and each having said predetermined data length, and producing error correction data from said derived write data equal in number to said predetermined number;

(c) means for writing in parallel both of the write data having said predetermined number and said error correction data, as a single error correcting data group, into a plurality of empty regions belonging to mutually different drives of said plurality of drives; and (d) means for invalidating data written into said plurality of disk drives for which said write data having said predetermined number includes the update data.

26. A disk array system as claimed in claim 25, wherein said writing means includes:

means for using a plurality of regions within said plurality of drives as empty regions for writing therein other error-correcting data groups, as a result of a plurality of groups of write data being invalidated by said invalidating means when all of one group of write data which belong to any one of error-correcting data groups stored in said plurality of drives are invalidated, said plurality of empty regions having held both of said one group of write data and error correction data belonging to said error-correcting data groups.

27. A disk array system as claimed in claim 25, further comprising:

means for selectively recovering each of a plurality of valid data among a plurality of data held in one drive among said plurality of drives, in which a fault occurs, by employing a plurality of other write data, valid or invalid, and error correction data, which are held in drives other than said one drive, and which belong to an error-correcting data group to which said plural valid data belong.

28. A disk array system as claimed in claim 25, further comprising:
- (e) means for replacing a plurality of valid write data contained in a plurality of error-correcting data groups (partially invalidated error-correcting data groups) including at least one piece of valid write data and at least one piece of invalidated write data;

said replacing means including:
- (e1) means for selectively reading from said plurality of drives, at least one piece of valid write data contained in all of the partially invalidated error-correcting data groups, and for writing at least one piece of read out valid write data into the cache memory;
- (e2) means for newly producing error correction data with respect to a new set of valid write data equal in number to said predetermined number, said new set of valid write data having been held in said cache memory and having been selected from a plurality of valid write data, and also said new set of valid write data, thereby generating new error-correcting data groups;
- (e3) means for rewriting said newly produced error-correcting data group into the empty regions in said plurality of drives; and
- (e4) means for using a plurality of regions which hold all of the valid write data contained in a plurality of partially invalidated error-correcting data groups, all of said valid write data being rewritten by said step (e3), as empty regions for writing other error-correcting data groups.

* * * * *